(12) United States Patent
Raring et al.

(10) Patent No.: US 10,424,900 B2
(45) Date of Patent: *Sep. 24, 2019

(54) LOW VOLTAGE LASER DIODES ON {20-21} GALLIUM AND NITROGEN CONTAINING SUBSTRATES

(71) Applicant: Soraa Laser Diode, Inc., Goleta, CA (US)

(72) Inventors: James W. Raring, Santa Barbara, CA (US); Mathew Schmidt, Goleta, CA (US); Christiane Poblenz, Goleta, CA (US)

(73) Assignee: Soraa Laser Diode, Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/144,328

(22) Filed: Sep. 27, 2018

(65) Prior Publication Data
US 2019/0103728 A1    Apr. 4, 2019

Related U.S. Application Data

(60) Continuation of application No. 15/820,047, filed on Nov. 21, 2017, now Pat. No. 10,090,644, which is a
(Continued)

(51) Int. Cl.
| | |
|---|---|
| *H01S 5/343* | (2006.01) |
| *H01S 5/34* | (2006.01) |
| *H01L 21/02* | (2006.01) |
| *B82Y 20/00* | (2011.01) |
| *H01S 5/20* | (2006.01) |

(Continued)

(52) U.S. Cl.
CPC ......... *H01S 5/34333* (2013.01); *B82Y 20/00* (2013.01); *H01L 21/0254* (2013.01); *H01L 21/02389* (2013.01); *H01L 21/02433* (2013.01); *H01S 5/2009* (2013.01); *H01S 5/227* (2013.01); *H01S 5/3202* (2013.01); *H01S 5/3407* (2013.01); *B28D 5/0011* (2013.01); *H01L 21/467* (2013.01); *H01S 5/0014* (2013.01); *H01S 5/0202* (2013.01); *H01S 5/028* (2013.01); *H01S 5/3213* (2013.01); *H01S 5/4025* (2013.01)

(58) Field of Classification Search
CPC ..... H01S 5/3407; H01S 5/3203; H01S 5/2009
USPC .......................... 372/44.011, 45.01
See application file for complete search history.

(56) References Cited

U.S. PATENT DOCUMENTS

| | | |
|---|---|---|
| 709,284 A | 9/1902 | Weigl |
| 4,341,592 A | 7/1982 | Shortes et al. |

(Continued)

FOREIGN PATENT DOCUMENTS

| | | |
|---|---|---|
| CN | 1538534 | 10/2004 |
| CN | 1702836 | 11/2005 |

(Continued)

OTHER PUBLICATIONS

U.S. Appl. No. 12/481,543, Non-Final Office Action dated Jun. 27, 2011, 10 pages.
(Continued)

*Primary Examiner* — Tod T Van Roy
(74) *Attorney, Agent, or Firm* — Kilpatrick Townsend & Stockton LLP

(57) ABSTRACT

A low voltage laser device having an active region configured for one or more selected wavelengths of light emissions.

15 Claims, 25 Drawing Sheets

Related U.S. Application Data continuation of application No. 15/363,756, filed on Nov. 29, 2016, now Pat. No. 9,853,420, which is a division of application No. 12/883,652, filed on Sep. 16, 2010, now Pat. No. 9,543,738, which is a continuation-in-part of application No. 12/883,093, filed on Sep. 15, 2010, now Pat. No. 8,355,418.

(60) Provisional application No. 61/249,568, filed on Oct. 7, 2009, provisional application No. 61/243,502, filed on Sep. 17, 2009.

(51) Int. Cl.
*H01S 5/32* (2006.01)
*H01S 5/227* (2006.01)
*B28D 5/00* (2006.01)
*H01L 21/467* (2006.01)
*H01S 5/00* (2006.01)
*H01S 5/02* (2006.01)
*H01S 5/028* (2006.01)
*H01S 5/40* (2006.01)

(56) References Cited

U.S. PATENT DOCUMENTS

| | | |
|---|---|---|
| 4,860,687 A | 8/1989 | Frijlink |
| 4,911,102 A | 3/1990 | Manabe et al. |
| 5,331,654 A | 7/1994 | Jewell et al. |
| 5,334,277 A | 8/1994 | Nakamura |
| 5,366,953 A | 11/1994 | Char et al. |
| 5,527,417 A | 6/1996 | Iida et al. |
| 5,607,899 A | 3/1997 | Yoshida et al. |
| 5,632,812 A | 5/1997 | Hirabayashi |
| 5,647,945 A | 7/1997 | Matsuse et al. |
| 5,696,389 A | 12/1997 | Ishikawa et al. |
| 5,821,555 A | 10/1998 | Saito et al. |
| 5,888,907 A | 3/1999 | Tomoyasu et al. |
| 5,926,493 A | 7/1999 | O'Brien et al. |
| 5,951,923 A | 9/1999 | Horie et al. |
| 6,069,394 A | 5/2000 | Hashimoto et al. |
| 6,072,197 A | 6/2000 | Horino et al. |
| 6,147,953 A | 11/2000 | Duncan |
| 6,153,010 A | 11/2000 | Kiyoku et al. |
| 6,239,454 B1 | 5/2001 | Glew et al. |
| 6,379,985 B1 | 4/2002 | Cervantes et al. |
| 6,451,157 B1 | 9/2002 | Hubacek |
| 6,489,636 B1 | 12/2002 | Goetz et al. |
| 6,586,762 B2 | 7/2003 | Kozaki |
| 6,635,904 B2 | 10/2003 | Goetz et al. |
| 6,680,959 B2 | 1/2004 | Tanabe et al. |
| 6,734,461 B1 | 5/2004 | Shiomi et al. |
| 6,755,932 B2 | 6/2004 | Masuda et al. |
| 6,809,781 B2 | 10/2004 | Setlur et al. |
| 6,814,811 B2 | 11/2004 | Ose |
| 6,833,564 B2 | 12/2004 | Shen et al. |
| 6,858,081 B2 | 2/2005 | Biwa et al. |
| 6,920,166 B2 | 7/2005 | Akasaka et al. |
| 7,009,199 B2 | 3/2006 | Hall |
| 7,033,858 B2 | 4/2006 | Chai et al. |
| 7,053,413 B2 | 5/2006 | D'Evelyn et al. |
| 7,063,741 B2 | 6/2006 | D'Evelyn et al. |
| 7,128,849 B2 | 10/2006 | Setlur et al. |
| 7,220,324 B2 | 5/2007 | Baker et al. |
| 7,303,630 B2 | 12/2007 | Motoki et al. |
| 7,312,156 B2 | 12/2007 | Granneman et al. |
| 7,323,723 B2 | 1/2008 | Ohtsuka et al. |
| 7,338,828 B2 | 3/2008 | Imer et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,470,555 B2 | 12/2008 | Matsumura |
| 7,483,466 B2 | 1/2009 | Uchida et al. |
| 7,489,441 B2 | 2/2009 | Scheible et al. |
| 7,491,984 B2 | 2/2009 | Koike et al. |
| 7,555,025 B2 | 6/2009 | Yoshida |
| 7,598,104 B2 | 10/2009 | Teng et al. |
| 7,691,658 B2 | 4/2010 | Kaeding et al. |
| 7,727,332 B2 | 6/2010 | Habel et al. |
| 7,733,571 B1 | 6/2010 | Li |
| 7,749,326 B2 | 7/2010 | Kim et al. |
| 7,806,078 B2 | 10/2010 | Yoshida |
| 7,858,408 B2 | 12/2010 | Mueller et al. |
| 7,862,761 B2 | 1/2011 | Okushima et al. |
| 7,923,741 B1 | 4/2011 | Zhai et al. |
| 7,939,354 B2 | 5/2011 | Kyono et al. |
| 7,968,864 B2 | 6/2011 | Akita et al. |
| 8,017,932 B2 | 9/2011 | Okamoto et al. |
| 8,044,412 B2 | 10/2011 | Murphy et al. |
| 8,124,996 B2 | 2/2012 | Raring et al. |
| 8,126,024 B1 | 2/2012 | Raring |
| 8,143,148 B1 | 3/2012 | Raring et al. |
| 8,242,522 B1 | 8/2012 | Raring |
| 8,247,887 B1 | 8/2012 | Raring et al. |
| 8,252,662 B1 | 8/2012 | Poblenz et al. |
| 8,254,425 B1 | 8/2012 | Raring |
| 8,259,769 B1 | 9/2012 | Raring et al. |
| 8,294,179 B1 | 10/2012 | Raring |
| 8,314,429 B1 | 11/2012 | Raring et al. |
| 8,355,418 B2 | 1/2013 | Raring et al. |
| 8,422,525 B1 | 4/2013 | Raring et al. |
| 8,427,590 B2 | 4/2013 | Raring et al. |
| 8,728,842 B2 | 5/2014 | Raring et al. |
| 9,048,170 B2 | 6/2015 | Pfister et al. |
| 9,531,164 B2 | 12/2016 | Raring et al. |
| 9,853,420 B2 | 12/2017 | Raring et al. |
| 10,090,644 B2 | 10/2018 | Raring et al. |
| 2002/0050488 A1 | 5/2002 | Nikitin et al. |
| 2002/0085603 A1 | 7/2002 | Okumura |
| 2002/0171092 A1 | 11/2002 | Goetz et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0129810 A1 | 7/2003 | Barth et al. |
| 2003/0140846 A1 | 7/2003 | Biwa et al. |
| 2003/0178617 A1 | 9/2003 | Appenzeller et al. |
| 2003/0200931 A1 | 10/2003 | Goodwin |
| 2003/0216011 A1 | 11/2003 | Nakamura et al. |
| 2004/0025787 A1 | 2/2004 | Selbrede et al. |
| 2004/0060518 A1 | 4/2004 | Nakamura et al. |
| 2004/0099213 A1 | 5/2004 | Adomaitis et al. |
| 2004/0104391 A1 | 6/2004 | Maeda et al. |
| 2004/0146264 A1 | 7/2004 | Auner et al. |
| 2004/0151222 A1 | 8/2004 | Sekine |
| 2004/0196877 A1 | 10/2004 | Kawakami et al. |
| 2004/0222357 A1 | 11/2004 | King et al. |
| 2004/0233950 A1 | 11/2004 | Furukawa et al. |
| 2004/0247275 A1 | 12/2004 | Vakhshoori et al. |
| 2004/0262624 A1 | 12/2004 | Akita et al. |
| 2005/0040384 A1 | 2/2005 | Tanaka et al. |
| 2005/0072986 A1 | 4/2005 | Sasaoka |
| 2005/0168564 A1 | 8/2005 | Kawaguchi et al. |
| 2005/0214992 A1 | 9/2005 | Chakraborty et al. |
| 2005/0224826 A1 | 10/2005 | Keuper et al. |
| 2005/0229855 A1 | 10/2005 | Raaijmakers |
| 2005/0247260 A1 | 11/2005 | Shin et al. |
| 2005/0285128 A1 | 12/2005 | Scherer et al. |
| 2006/0030738 A1 | 2/2006 | Vanmaele et al. |
| 2006/0033009 A1 | 2/2006 | Kobayashi et al. |
| 2006/0037529 A1 | 2/2006 | D'Evelyn et al. |
| 2006/0038193 A1 | 2/2006 | Wu et al. |
| 2006/0060131 A1 | 3/2006 | Atanackovic |
| 2006/0066319 A1 | 3/2006 | Dallenbach et al. |
| 2006/0077795 A1 | 4/2006 | Kitahara et al. |
| 2006/0078022 A1 | 4/2006 | Kozaki et al. |
| 2006/0079082 A1 | 4/2006 | Bruhns et al. |
| 2006/0086319 A1 | 4/2006 | Kasai et al. |
| 2006/0118799 A1 | 6/2006 | D'Evelyn et al. |
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0189098 A1 | 8/2006 | Edmond |

(56) References Cited

U.S. PATENT DOCUMENTS

| | | |
|---|---|---|
| 2006/0193359 A1 | 8/2006 | Kuramoto |
| 2006/0205199 A1 | 9/2006 | Baker et al. |
| 2006/0216416 A1 | 9/2006 | Sumakeris et al. |
| 2006/0256482 A1 | 11/2006 | Araki et al. |
| 2006/0288928 A1 | 12/2006 | Eom et al. |
| 2007/0081857 A1 | 4/2007 | Yoon |
| 2007/0086916 A1 | 4/2007 | Leboeuf et al. |
| 2007/0093073 A1 | 4/2007 | Farrell, Jr. et al. |
| 2007/0101932 A1 | 5/2007 | Schowalter et al. |
| 2007/0110112 A1 | 5/2007 | Sugiura |
| 2007/0120141 A1 | 5/2007 | Moustakas et al. |
| 2007/0153866 A1 | 7/2007 | Shchegrov et al. |
| 2007/0163490 A1 | 7/2007 | Habel et al. |
| 2007/0166853 A1 | 7/2007 | Guenther et al. |
| 2007/0184637 A1 | 8/2007 | Haskell et al. |
| 2007/0217462 A1 | 9/2007 | Yamasaki |
| 2007/0242716 A1 | 10/2007 | Samal et al. |
| 2007/0252164 A1 | 11/2007 | Zhong et al. |
| 2007/0259464 A1 | 11/2007 | Bour et al. |
| 2007/0272933 A1 | 11/2007 | Kim et al. |
| 2007/0280320 A1 | 12/2007 | Feezell et al. |
| 2008/0087919 A1 | 4/2008 | Tysoe et al. |
| 2008/0092812 A1 | 4/2008 | Mcdiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191192 A1 | 8/2008 | Feezell et al. |
| 2008/0191223 A1 | 8/2008 | Nakamura et al. |
| 2008/0198881 A1 | 8/2008 | Farrell et al. |
| 2008/0210958 A1 | 9/2008 | Senda et al. |
| 2008/0217745 A1 | 9/2008 | Miyanaga et al. |
| 2008/0232416 A1 | 9/2008 | Okamoto et al. |
| 2008/0251020 A1 | 10/2008 | Franken et al. |
| 2008/0285609 A1 | 11/2008 | Ohta et al. |
| 2008/0291961 A1 | 11/2008 | Kamikawa et al. |
| 2008/0303033 A1 | 12/2008 | Brandes |
| 2008/0308815 A1 | 12/2008 | Kasai et al. |
| 2008/0315179 A1 | 12/2008 | Kim et al. |
| 2009/0021723 A1 | 1/2009 | De Lega |
| 2009/0028204 A1 | 1/2009 | Hiroyama et al. |
| 2009/0058532 A1 | 3/2009 | Kikkawa et al. |
| 2009/0066241 A1 | 3/2009 | Yokoyama |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0081867 A1 | 3/2009 | Taguchi et al. |
| 2009/0141765 A1 | 6/2009 | Kohda et al. |
| 2009/0153752 A1 | 6/2009 | Silverstein |
| 2009/0159869 A1 | 6/2009 | Ponce et al. |
| 2009/0166668 A1 | 7/2009 | Shakuda |
| 2009/0229519 A1 | 9/2009 | Saitoh |
| 2009/0238227 A1 | 9/2009 | Kubota et al. |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0316116 A1 | 12/2009 | Melville et al. |
| 2009/0320744 A1 | 12/2009 | D'Evelyn |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0006546 A1 | 1/2010 | Young et al. |
| 2010/0006873 A1 | 1/2010 | Raring et al. |
| 2010/0025656 A1 | 2/2010 | Raring et al. |
| 2010/0031875 A1 | 2/2010 | D'Evelyn |
| 2010/0044718 A1 | 2/2010 | Hanser et al. |
| 2010/0096615 A1 | 4/2010 | Okamoto et al. |
| 2010/0104495 A1 | 4/2010 | Kawabata et al. |
| 2010/0140630 A1 | 6/2010 | Hamaguchi et al. |
| 2010/0140745 A1 | 6/2010 | Khan et al. |
| 2010/0151194 A1 | 6/2010 | D'Evelyn |
| 2010/0195687 A1 | 8/2010 | Okamoto et al. |
| 2010/0220262 A1 | 9/2010 | Demille et al. |
| 2010/0276663 A1 | 11/2010 | Enya et al. |
| 2010/0295054 A1 | 11/2010 | Okamoto et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2011/0031508 A1 | 2/2011 | Hamaguchi et al. |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0075694 A1 | 3/2011 | Yoshizumi et al. |
| 2011/0103418 A1 | 5/2011 | Hardy et al. |
| 2011/0129669 A1 | 6/2011 | Fujito et al. |
| 2011/0164637 A1 | 7/2011 | Yoshizumi et al. |
| 2011/0180781 A1 | 7/2011 | Raring et al. |
| 2011/0182056 A1 | 7/2011 | Trottier et al. |
| 2011/0186874 A1 | 8/2011 | Shum |
| 2011/0186887 A1 | 8/2011 | Trottier et al. |
| 2011/0216795 A1 | 9/2011 | Hsu et al. |
| 2011/0247556 A1 | 10/2011 | Raring et al. |
| 2011/0281422 A1 | 11/2011 | Wang et al. |
| 2011/0286484 A1 | 11/2011 | Raring et al. |
| 2012/0104359 A1 | 5/2012 | Felker et al. |
| 2012/0178198 A1 | 7/2012 | Raring et al. |
| 2012/0187371 A1 | 7/2012 | Raring et al. |
| 2012/0314398 A1 | 12/2012 | Raring et al. |
| 2013/0234111 A1 | 9/2013 | Pfister et al. |
| 2017/0331255 A1 | 11/2017 | Raring et al. |

FOREIGN PATENT DOCUMENTS

| | | |
|---|---|---|
| CN | 101009347 | 8/2007 |
| CN | 101079463 | 11/2007 |
| CN | 101099245 | 1/2008 |
| CN | 101171692 | 4/2008 |
| JP | 09036430 | 2/1997 |
| JP | 2000294883 | 10/2000 |
| JP | 2001160627 | 6/2001 |
| JP | 2002185085 | 6/2002 |
| JP | 2006173621 | 6/2006 |
| JP | 2007173467 | 7/2007 |
| JP | 2008311640 | 12/2008 |
| WO | 2004084275 | 9/2004 |
| WO | 2008041521 | 4/2008 |
| WO | 2010138923 | 2/2010 |
| WO | 2010120819 | 10/2010 |

OTHER PUBLICATIONS

U.S. Appl. No. 12/482,440, Final Office Action dated Aug. 12, 2011, 7 pages.
U.S. Appl. No. 12/482,440, Non-Final Office Action dated Feb. 23, 2011, 6 pages.
U.S. Appl. No. 12/484,924, Final Office Action dated Oct. 31, 2011, 11 pages.
U.S. Appl. No. 12/484,924, Non-Final Office Action dated Apr. 14, 2011, 12 pages.
U.S. Appl. No. 12/491,169, Final Office Action dated May 11, 2011, 10 pages.
U.S. Appl. No. 12/491,169, Non-Final Office Action dated Oct. 22, 2010, 10 pages.
U.S. Appl. No. 12/497,289, Non-Final Office Action dated Feb. 2, 2012, 7 pages.
U.S. Appl. No. 12/497,289, Notice of Allowance dated May 22, 2012, 7 pages.
U.S. Appl. No. 12/502,058, Final Office Action dated Aug. 19, 2011, 13 pages.
U.S. Appl. No. 12/502,058, Non-Final Office Action dated Dec. 8, 2010, 15 pages.

(56) References Cited

OTHER PUBLICATIONS

U.S. Appl. No. 12/502,058, Notice of Allowance dated Apr. 16, 2012, 10 pages.
U.S. Appl. No. 12/502,058, Notice of Allowance dated Jul. 19, 2012, 8 pages.
U.S. Appl. No. 12/534,829, Non-Final Office Action dated Apr. 19, 2011, 9 pages.
U.S. Appl. No. 12/534,829, Notice of Allowance dated Oct. 28, 2011, 8 pages.
U.S. Appl. No. 12/573,820, Final Office Action dated Oct. 11, 2011, 23 pages.
U.S. Appl. No. 12/573,820, Non-Final Office Action dated Mar. 2, 2011, 19 pages.
U.S. Appl. No. 12/573,820, filed Oct. 5, 2009.
U.S. Appl. No. 12/727,148, U.S. Patent Application No. dated Mar. 18, 2010, 41 pages.
U.S. Appl. No. 12/749,466, Final Office Action dated Feb. 3, 2012, 16 pages.
U.S. Appl. No. 12/749,466, Non-Final Office Action dated Jul. 3, 2012, 18 pages.
U.S. Appl. No. 12/749,466, Non-Final Office Action dated Jun. 29, 2011, 20 pages.
U.S. Appl. No. 12/749,476, Final Office Action dated Nov. 8, 2011, 11 pages.
U.S. Appl. No. 12/749,476, Non-Final Office Action dated Apr. 11, 2011, 15 pages.
U.S. Appl. No. 12/749,476, Notice of Allowance dated Jun. 26, 2012, 8 pages.
U.S. Appl. No. 12/749,476, Notice of Allowance dated May 4, 2012, 8 pages.
U.S. Appl. No. 12/759,273, Final Office Action dated Jun. 26, 2012, 10 pages.
U.S. Appl. No. 12/759,273, Non-Final Office Action dated Nov. 21, 2011, 10 pages.
U.S. Appl. No. 12/762,269, Non-Final Office Action dated Oct. 12, 2011, 12 pages.
U.S. Appl. No. 12/762,269, Notice of Allowance dated Apr. 23, 2012, 8 pages.
U.S. Appl. No. 12/762,271, Final Office Action dated Jun. 6, 2012, 13 pages.
U.S. Appl. No. 12/762,271, Non-Final Office Action dated Dec. 23, 2011, 12 pages.
U.S. Appl. No. 12/762,271, Notice of Allowance dated Aug. 8, 2012, 9 pages.
U.S. Appl. No. 12/762,278, Notice of Allowance dated Nov. 7, 2011, 11 pages.
U.S. Appl. No. 12/778,718, Non-Final Office Action dated Nov. 25, 2011, 12 pages.
U.S. Appl. No. 12/778,718, Notice of Allowance dated Apr. 3, 2012, 14 pages.
U.S. Appl. No. 12/778,718, Notice of Allowance dated Jun. 13, 2012, 7 pages.
U.S. Appl. No. 12/789,303, Non-Final Office Action dated Sep. 24, 2012, 20 pages.
U.S. Appl. No. 12/859,153, Non-Final Office Action dated Sep. 25, 2012, 22 pages.
U.S. Appl. No. 12/868,441, Non-Final Office Action dated Apr. 30, 2012, 12 pages.
U.S. Appl. No. 12/880,803, Non-Final Office Action dated Feb. 22, 2012, 9 pages.
U.S. Appl. No. 12/880,803, Notice of Allowance dated Jul. 18, 2012, 5 pages.
U.S. Appl. No. 12/880,889, filed Sep. 13, 2010, 18 pages.
U.S. Appl. No. 12/883,093, Final Office Action dated Aug. 3, 2012, 13 pages.
U.S. Appl. No. 12/883,093, Non-Final Office Action dated Mar. 13, 2012, 12 pages.
U.S. Appl. No. 12/883,093, Notice of Allowance dated Nov. 21, 2012, 12 pages.
U.S. Appl. No. 12/883,652, Final Office Action dated Oct. 26, 2015, 11 pages.
U.S. Appl. No. 12/883,652, Final Office Action dated Jan. 11, 2013, 12 pages.
U.S. Appl. No. 12/883,652, Final Office Action dated Dec. 19, 2014, 16 pages.
U.S. Appl. No. 12/883,652, Non-Final Office Action dated Apr. 5, 2016, 12 pages.
U.S. Appl. No. 12/883,652, Non-Final Office Action dated May 14, 2014, 14 pages.
U.S. Appl. No. 12/883,652, Non-Final Office Action dated Jun. 3, 2015, 16 pages.
U.S. Appl. No. 12/883,652, Non-Final Office Action dated Apr. 17, 2012, 8 pages.
U.S. Appl. No. 12/883,652, Notice of Allowance dated Aug. 30, 2016, 7 pages.
U.S. Appl. No. 12/884,993, Final Office Action dated Aug. 2, 2012, 15 pages.
U.S. Appl. No. 12/884,993, Non-Final Office Action dated Mar. 16, 2012, 15 pages.
U.S. Appl. No. 12/884,993, Notice of Allowance dated Nov. 26, 2012, 11 pages.
U.S. Appl. No. 12/942,817, Non-Final Office Action dated Feb. 20, 2013, 12 pages.
U.S. Appl. No. 12/963,238, filed Oct. 5, 2009.
U.S. Appl. No. 12/995,946, Non-Final Office Action dated Mar. 28, 2012, 18 pages.
U.S. Appl. No. 13/014,622, Final Office Action dated Apr. 30, 2012, 14 pages.
U.S. Appl. No. 13/014,622, Non-Final Office Action dated Nov. 28, 2011, 14 pages.
U.S. Appl. No. 13/046,565, Final Office Action dated Feb. 2, 2012, 17 pages.
U.S. Appl. No. 13/046,565, Final Office Action dated Jul. 19, 2012, 24 pages.
U.S. Appl. No. 13/046,565, Non-Final Office Action dated Nov. 7, 2011, 17 pages.
U.S. Appl. No. 13/046,565, Non-Final Office Action dated Apr. 13, 2012, 40 pages.
U.S. Appl. No. 13/354,639, Non-Final Office Action dated Nov. 7, 2012, 12 pages.
U.S. Appl. No. 13/425,354, Final Office Action dated Aug. 2, 2013, 16 pages.
U.S. Appl. No. 13/425,354, Non-Final Office Action dated Feb. 14, 2013, 13 pages.
U.S. Appl. No. 13/425,354, Notice of Allowance dated Feb. 7, 2014, 8 pages.
U.S. Appl. No. 15/363,756, Notice of Allowance dated Aug. 10, 2017, 10 pages.
U.S. Appl. No. 15/820,047, Notice of Allowance dated May 30, 2018, 8 pages.
U.S. Appl. No. 61/182,105, filed May 29, 2009, 10 pages.
U.S. Appl. No. 61/347,800, filed May 24, 2010, 56 pages.
Abare et al., Cleaved and Etched Facet Nitride Laser Diodes, IEEE Journal of Selected Topics in Quantum Electronics, vol. 4, Issue 3, May-Jun. 1998, pp. 505-509.
Aoki et al., InGaAs/InGaAsP MQW Electroabsorption Modulator Integrated with a DFB Laser Fabricated by Band-Gap Energy Control Selective Area MOCVD, IEEE Journal of Quantum Electronics, vol. 29, Issue 6, Jun. 1993, pp. 2088-2096.
Asano et al., 100-mW Kink-Free Blue-Violet Laser Diodes with Low Aspect Ratio, IEEE Journal of Quantum Electronics, vol. 39, Issue 1, Jan. 2003, pp. 135-140.
Bernardini et al., Spontaneous Polarization and Piezoelectric Constants of III-V Nitrides, Physical Review B, vol. 56, Issue 16, Oct. 15, 1997, pp. R10024-R10027.
Caneau et al., Studies on the Selective OMVPE of (Ga,In)/(As,P), Journal of Crystal Growth, vol. 124, Issue 1-4, Nov. 1992, pp. 243-248.
Chen et al., Growth and Optical Properties of Highly Uniform and Periodic InGaN Nanostructures, Advanced Materials, vol. 19, Issue 13, Jul. 2007, pp. 1707-1710.

(56) References Cited

OTHER PUBLICATIONS

Chinese Application No. 200980134723.8, Office Action dated Nov. 1, 2012, 35 pages (14 pages for the original document and 21 pages for the English translation).
German Application No. 112010003697.7, Office Action dated Apr. 11, 2013, 13 pages (7 pages for the original document and 6 pages for the English translation).
D'Evelyn et al., Bulk GaN Crystal Growth by the High-Pressure Ammonothermal Method, Journal of Crystal Growth, vol. 300, Issue 1, Mar. 1, 2007, pp. 11-16.
Enya et al., 531 nm Green Lasing of InGaN Based Laser Diodes on Semi-Polar {20\bar21} Free-Standing GaN Substrates, Applied Physics Express, vol. 2, 082101, Jul. 2009, pp. 1-3.
Founta et al., Anisotropic Morphology of Nonpolar a-Plane GaN Quantum Dots and Quantum Wells, Journal of Applied Physics, vol. 102, Issue 7, 074304, Oct. 2, 2007, pp. 1-6.
Franssila, Tools for CVD and Epitaxy, Introduction to Microfabrication, 2004, pp. 329-336.
Fujii et al., Increase in the Extraction Efficiency of GaN-Based Light-Emitting Diodes via Surface Roughening, Applied Physics Letters, vol. 84, Issue 6, Feb. 9, 2004, pp. 855-857.
Funato et al., Blue, Green, and Amber InGaN/GaN Light-Emitting Diodes on Semipolar {11-22} GaN Bulk Substrates, Journal of Japanese Applied Physics, vol. 45, No. 26, 2006, pp. L659-L662.
Funato et al., Monolithic Polychromatic Light-Emitting Diodes Based on InGaN Microfacet Quantum Wells toward Tailor-Made Solid-State Lighting, Applied Physics Express, vol. 1, 011106, 2008, pp. 1-3.
Gardner et al., Blue-Emitting InGaN—GaN Double-Heterostructure Light-Emitting Diodes Reaching Maximum Quantum Efficiency Above 200A/cm2, Applied Physics Letters, vol. 91, Issue 24, 243506, 2007, pp. 1-3.
Hiramatsu et al., Selective Area Growth and Epitaxial Lateral Overgrowth of GaN by Metalorganic Vapor Phase Epitaxy and Hydride Vapor Phase Epitaxy, Materials Science and Engineering: B, vol. 59, Issue 1-3, May 6, 1999, pp. 104-111.
Iso et al., High Brightness Blue InGaN/GaN Light Emitting Diode on Nonpolar m-Plane Bulk GaN Substrate, Japanese Journal of Applied Physics, vol. 46, No. 40, 2007, pp. L960-L962.
Kendall et al., Energy Savings Potential of Solid State Lighting in General Lighting Applications, Report for the Department of Energy, Apr. 2001, 35 pages.
Khan et al., Cleaved Cavity Optically Pumped InGaN-GaN Laser Grown on Spinel Substrates, Applied Physics Letters, vol. 69, Issue 16, Oct. 14, 1996, pp. 2418-2420.
Kim et al., Improved Electroluminescence on Nonpolar m-Plane InGaN/GaN Quantum Well LEDs, Physica Status Solidi (RRL), vol. 1, Issue 3, May 2007, pp. 125-127.
Kuramoto et al., Novel Ridge-Type InGaN Multiple-Quantum-Well Laser Diodes Fabricated by Selective Area Re-Growth on n-GaN Substrates, Journal of Japanese Applied Physics, vol. 40, Sep. 15, 2001, pp. L925-L927.
Lin et al., Influence of Separate Confinement Heterostructure Layer on Carrier Distribution in InGaAsP Laser Diodes with Nonidentical Multiple Quantum Wells, Japanese Journal of Applied Physics, vol. 43, No. 10, Oct. 2004, pp. 7032-7035.
Masui et al., Electrical Characteristics of Nonpolar InGaN-Based Light-Emitting Diodes Evaluated at Low Temperature, Japanese Journal of Applied Physics, vol. 46, No. 11, Nov. 2007, pp. 7309-7310.
Michiue et al., Recent Development of Nitride LEDs and LDs, Proceedings of SPIE, vol. 7216, 72161Z, Feb. 16, 2009, pp. 1-6.
Nakamura et al., InGaN/GaN/AlGaN-Based Laser Diodes with Modulation-Doped Strained-Layer Superlattices Grown on an Epitaxially Laterally Overgrown GaN Substrate, Applied Physics Letters, vol. 72, Issue 2, Jan. 12, 1998, pp. 211-213.
Nam et al., Lateral Epitaxial Overgrowth of GaN Films on SiO2 Areas via Metalorganic Vapor Phase Epitaxy, Journal of Electronic Materials, vol. 27, Issue 4, Apr. 1998, pp. 233-237.

Okamoto et al., Continuous-Wave Operation of m-Plane InGaN Multiple Quantum Well Laser Diodes, The Japan Society of Applied Physics, JJAP Express Letter, vol. 46, No. 9, Feb. 2007, pp. L187-L189.
Okamoto et al., High-Efficiency Continuous-Wave Operation of Blue-Green Laser Diodes Based on Nonpolar m-Plane Gallium Nitride, The Japan Society of Applied Physics, Applied Physics Express, vol. 1, No. 7, 072201, Jun. 20, 2008, pp. 1-3.
Okamoto et al., Pure Blue Laser Diodes Based on Nonpolar m-Piane Gallium Nitride with InGaN Waveguiding Layers, Journal of Japanese Applied Physics, vol. 46, No. 35, 2007, pp. L820-L822.
Okubo, Nichia Develops Blue-Green Semiconductor Laser w/ 488nm Wavelength, Nikkei Technology Online, Available Online at: http://techon.nikkeibp.co.jp/english/NEWS_EN/20080122/146009/, Jan. 22, 2008, pp. 1-3.
Park, Crystal Orientation Effects on Electronic Properties of Wurtzite InGaN/GaN Quantum Wells, Journal of Applied Physics, vol. 91, Issue 12, Jun. 15, 2002, pp. 9904-9908.
International Application No. PCT/US2009/046786, International Search Report and Written Opinion dated May 13, 2010, 8 pages.
International Application No. PCT/US2009/047107, International Search Report and Written Opinion dated Sep. 29, 2009, 10 pages.
International Application No. PCT/US2009/052611, International Search Report and Written Opinion dated Sep. 29, 2009, 11 pages.
International Application No. PCT/US2010/030939, International Search Report and Written Opinion dated Jun. 16, 2010, 9 pages.
International Application No. PCT/US2010/049172, International Search Report and Written Opinion dated Nov. 17, 2010, 7 pages.
International Application No. PCT/US2011/037792, International Search Report and Written Opinion dated Sep. 8, 2011, 9 pages.
International Application No. PCT/US2011/060030, International Search Report and Written Opinion dated Mar. 21, 2012, 8 pages.
Purvis, Changing the Crystal Face of Gallium Nitride, The Advance Semiconductor Magazine, III-Vs Review, vol. 18, Issue 8, Nov. 2005, 3 pages.
Romanov et al., Strain-Induced Polarization in Wurtzite III-Nitride Semipolar Layers, Journal of Applied Physics, vol. 100, Issue 2, 023522, May 2006, pp. 1-10.
Sato et al., High Power and High Efficiency Green Light Emitting Diode on Free-Standing Semipolar (1122) Bulk GaN Substrate, Physica Status Sol. (RRL), vol. 1, Issue 4, Jun. 15, 2007, pp. 162-164.
Sato et al., Optical Properties of Yellow Light-Emitting-Diodes Grown on Semipolar (1122) Bulk GaN Substrate, Applied Physics Letter, vol. 92, No. 22, 221110, Jun. 2008, pp. 1-3.
Schmidt et al., Demonstration of Nonpolar m-Plane InGaN/GaN Laser Diodes, Japanese Journal of Applied Physics, vol. 46, No. 9, Feb. 2007, pp. L190-L191.
Schmidt et al., High Power and High External Efficiency m-Plane InGaN Light Emitting Diodes, Japanese Journal of Applied Physics, vol. 46, No. 7, Feb. 2007, pp. L126-L128.
Schoedl et al., Facet Degradation of GaN Heterostructure Laser Diodes, Journal of Applied Physics, vol. 97, Issue 12, 123102, 2005, pp. 1-8.
Shchekin et al., High Performance Thin-Film Flip-Chip InGaN—GaN Light-Emitting Diodes, Applied Physics Letters, vol. 89, Issue 7, 071109, 2006, pp. 1-3.
Shen et al., Auger Recombination in InGaN Measured by Photoluminescence, Applied Physics Letters, vol. 91, Issue 14, 141101, 2007, pp. 1-3.
Sizov et al., 500-nm Optical Gain Anisotropy of Semipolar (1122) InGaN Quantum Wells, Applied Physics Express, vol. 2, No. 7, 071001, Jun. 19, 2009, pp. 1-3.
Tomiya et al., Dislocation Related Issues in the Degradation of GaN-Based Laser Diodes, IEEE Journal of Selected Topics in Quantum Electronics, vol. 10, Issue 6, Nov.-Dec. 2004, pp. 1277-1286.
Tyagi et al., High Brightness Violet InGan/Gan Light EMitting Diodes on Semipolar (1011) Bulk Gan Substrates, Japanese Journal of Applied Physics, vol. 46, No. 7, Feb. 9, 2007, pp. L129-L131.
Uchida et al., Recent Progress in High-Power Blue-Violet Lasers, IEEE Journal of Selected Topics in Quantum Electronics, vol. 9, Issue 5, Sep.-Oct. 2003, pp. 1252-1259.

(56) References Cited

OTHER PUBLICATIONS

Waltereit et al., Nitride Semiconductors Free of Electrostatic Fields for Efficient White Light-Emitting Diodes, Nature, vol. 406, Aug. 24, 2000, pp. 865-868.

Wierer et al., High-Power AlGaInN Flip-Chip Light-Emitting Diodes, Applied Physics Letters, vol. 78, Issue 22, May 28, 2001, pp. 3379-3381.

Yamaguchi, Anisotropic Optical Matrix Elements in Strained GaN-Quantum Wells with Various Substrate Orientations, Physica Status Solidi (PSS), vol. 5, Issue 6, May 2008, pp. 2329-2332.

Yoshizumi et al., Continuous-Wave Operation of 520 nm Green InGaN-Based Laser Diodes on Semi-Polar {2021} GaN Substrates, Applied Physics Express, vol. 2, No. 9, 092101, Aug. 2009, pp. 1-3.

Yu et al., Multiple Wavelength Emission from Semipolar InGaN/GaN Quantum Wells Selectively Grown by MOCVD, Conference on Lasers and Electro-Optics/Quantum Electronics and Laser Science Conference and Photonic Applications Systems Technologies, May 2007, 2 pages.

Zhong et al., Demonstration of High Power Blue-Green Light Emitting Diode on Semipolar (1122) Bulk GaN Substrate, Electronics Letters, vol. 43, Issue 15, Jul. 19, 2007, 2 pages.

Zhong et al., High Power and High Efficiency Blue Light Emitting Diode on Freestanding Semipolar (1011) Bulk GaN Substrate, Applied Physics Letter, vol. 90, No. 23, 233504, 2007, pp. 1-3.

Figure 1: Projection of c-direction laser diode on {20-21} GaN substrate with cleaved mirror

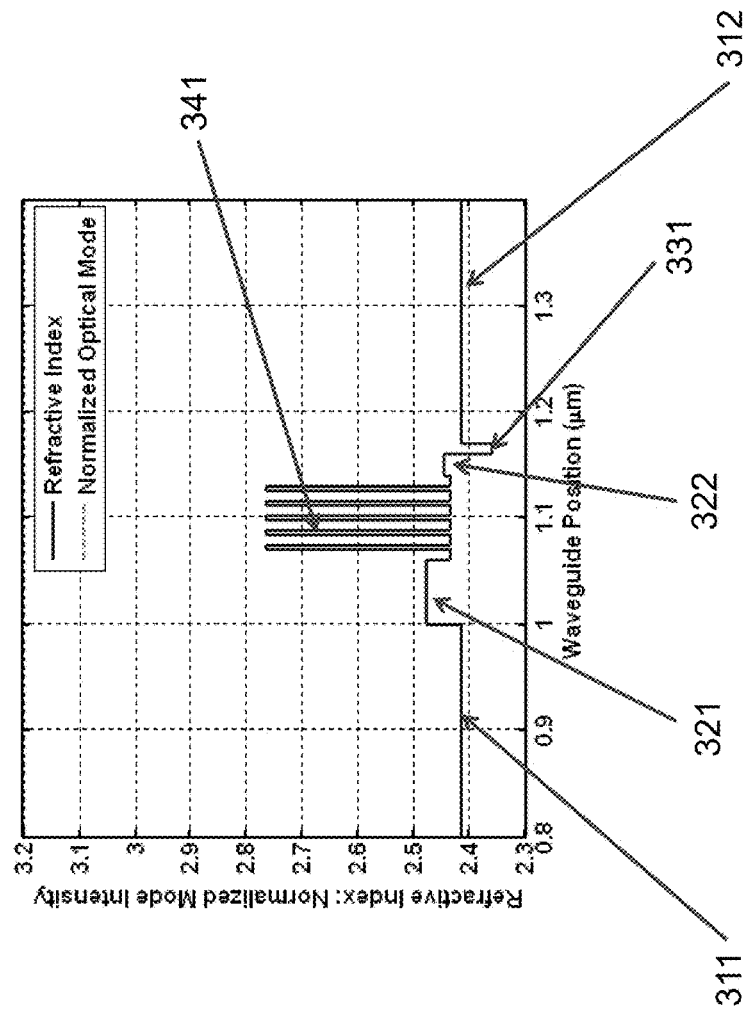
Figure 3: Index profile of laser structure on {20-21}

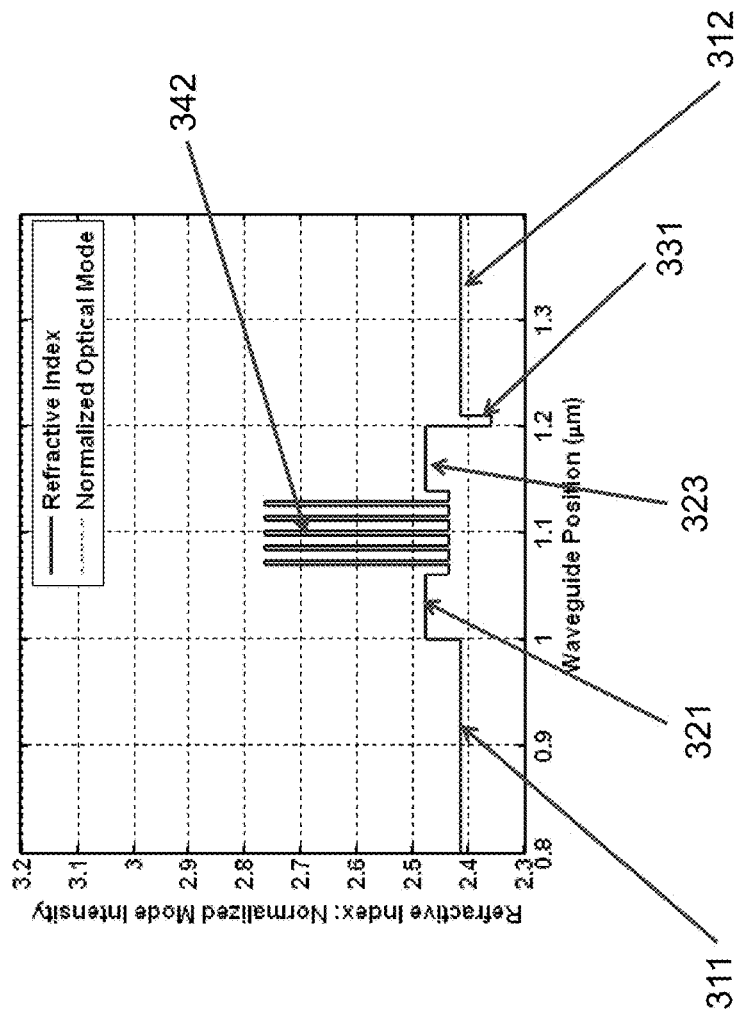
Figure 3A: Index profile of laser structure on {20-21}

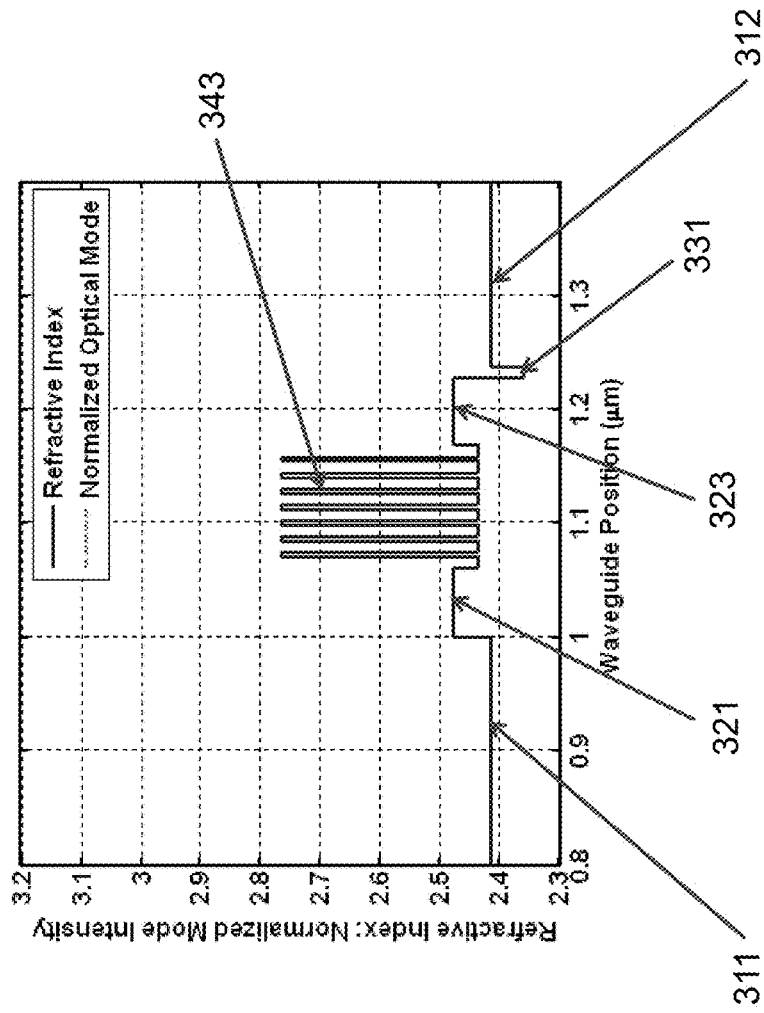
Figure 3B: Index profile of laser structure on {20-21}

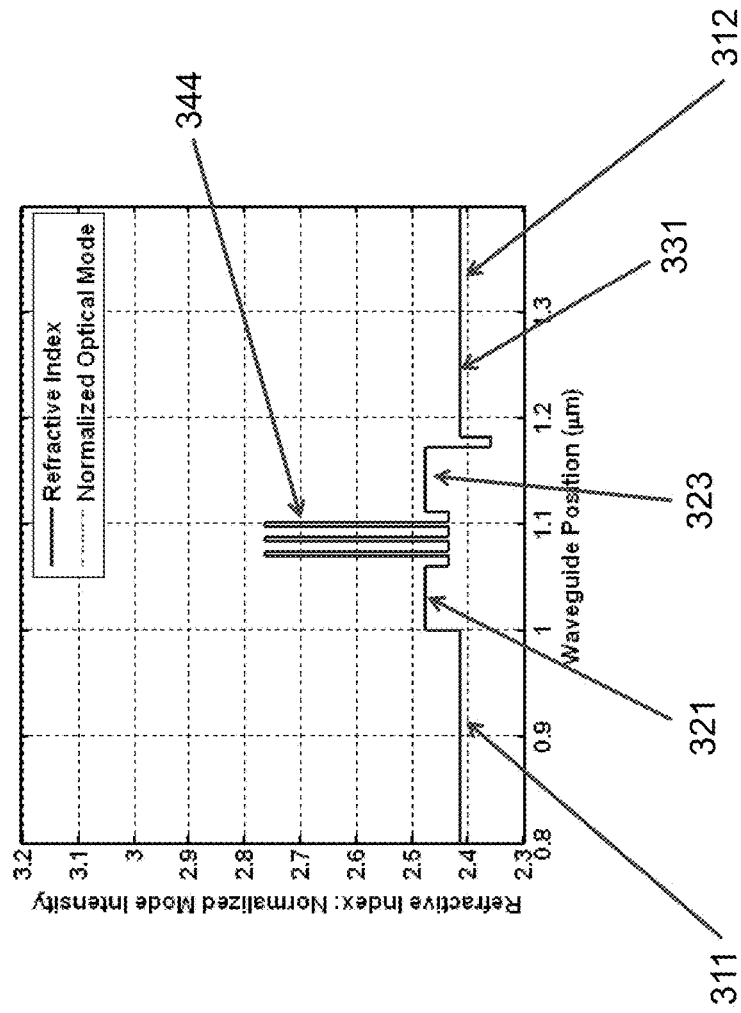
Figure 3C: Index profile of laser structure on {20-21}

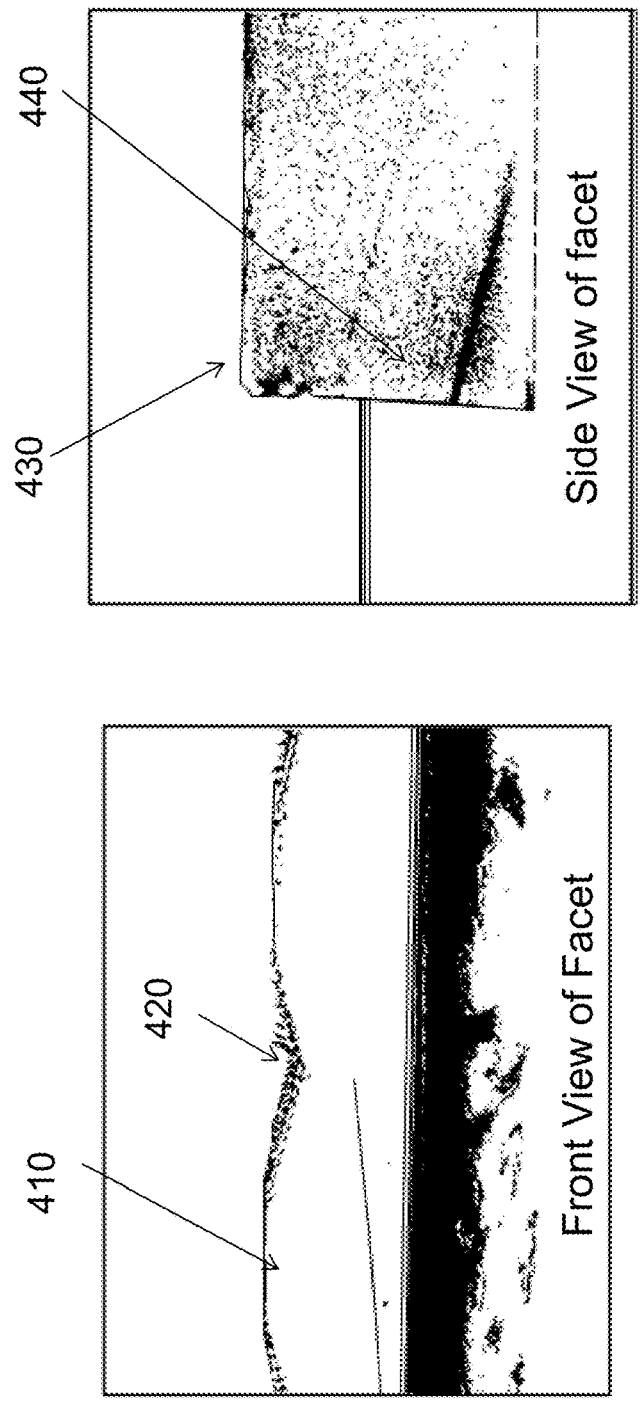
Figure 4: (20-21) c-projection Top-Side Skip-Scribe Facet Cleave

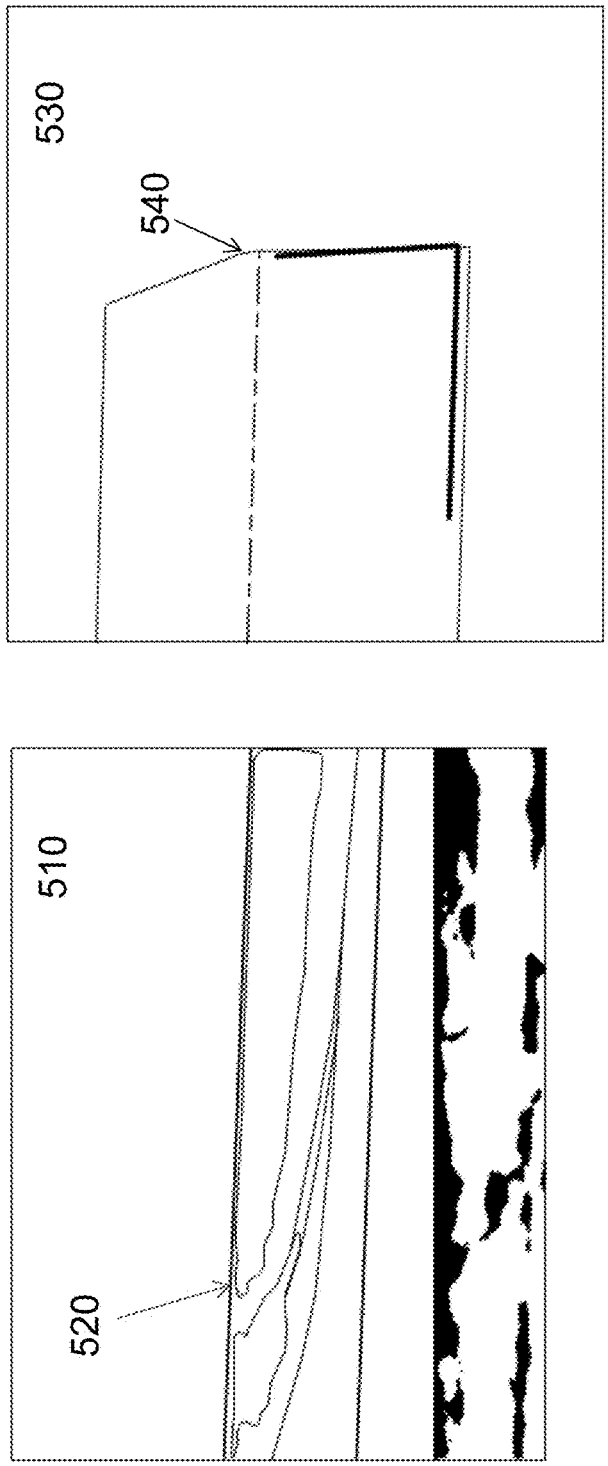
Figure 5: (20-21) c-projection Back-Side Continuous-Scribe Facet Cleave

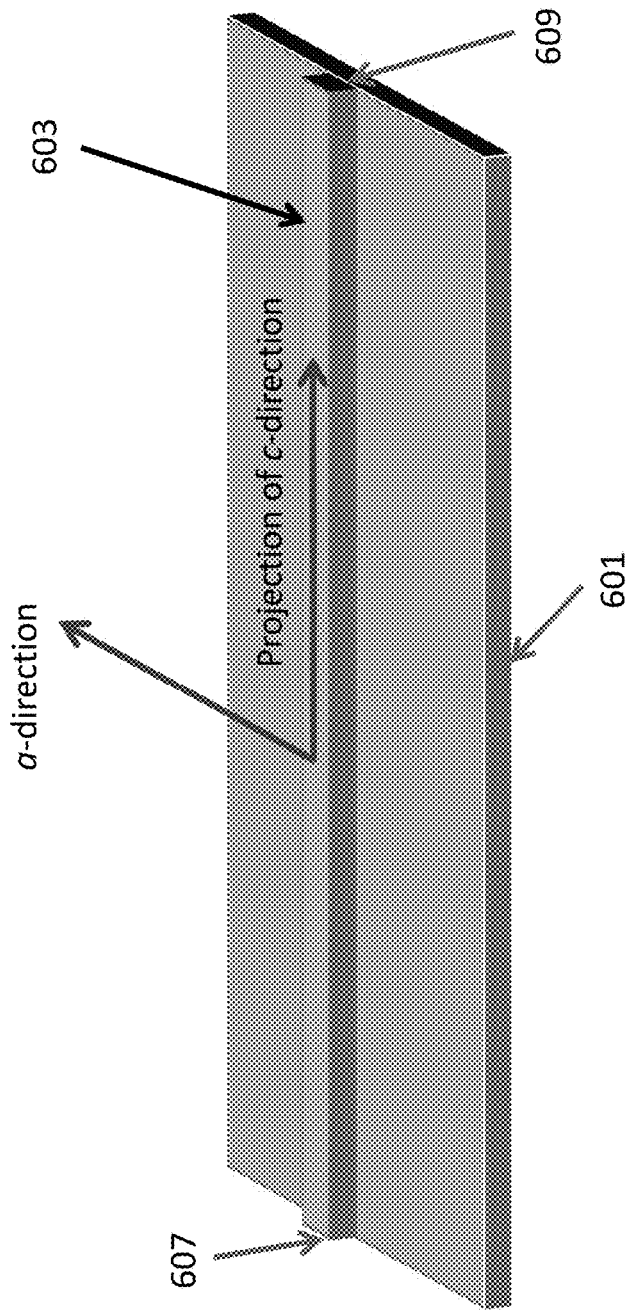
Figure 6: Projection of c-direction laser diode on {30-31} GaN substrate with cleaved mirror

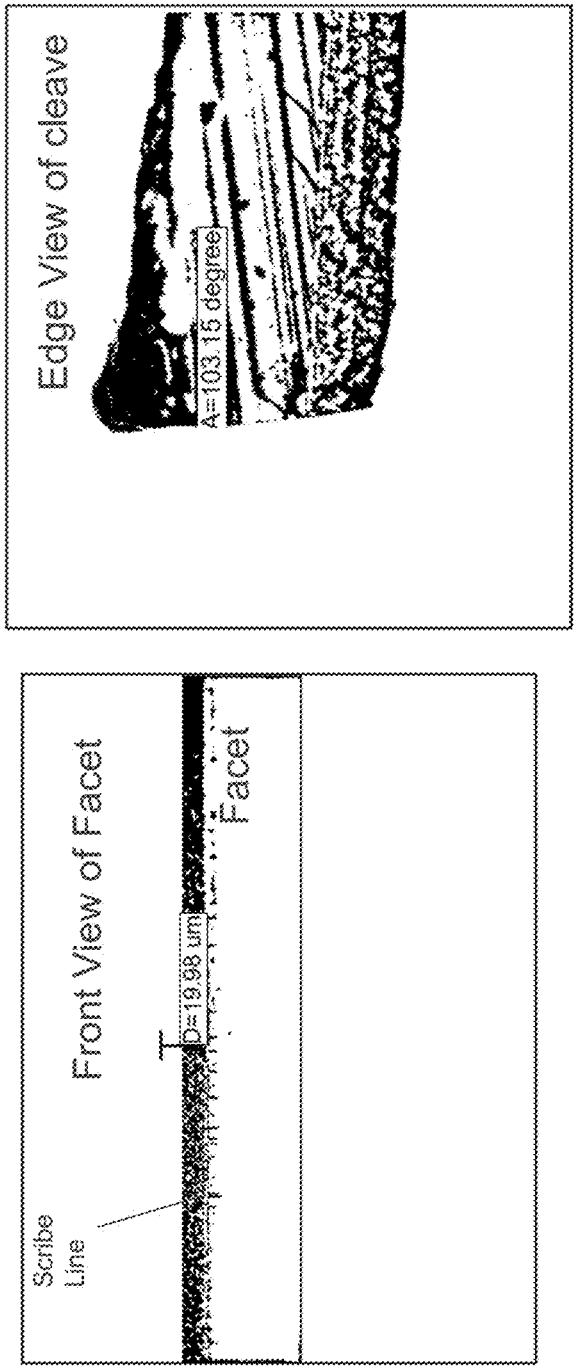
Figure 7 (30-31) c-projection Back-Side Continuous-Scribe Facet Cleave

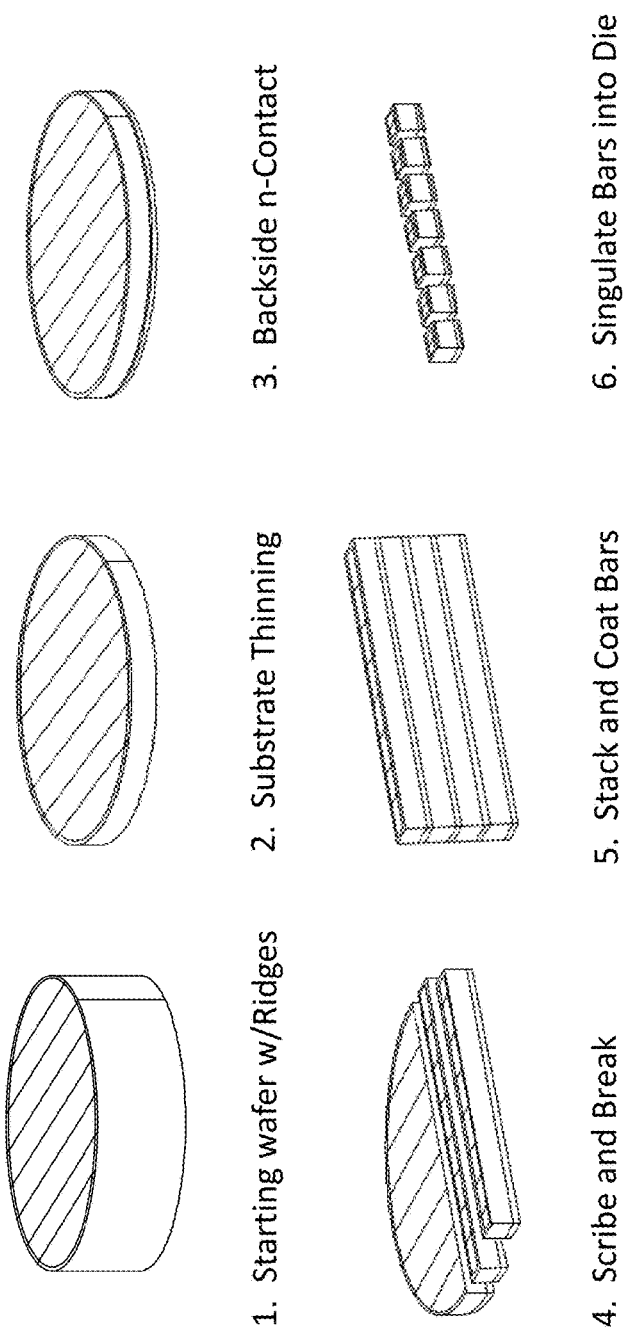
Figure 8: Backend Process Flow

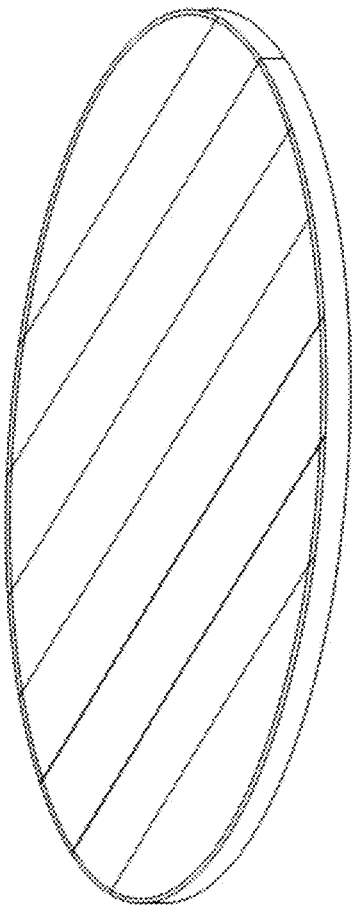
Figure 9: Substrate Thinning

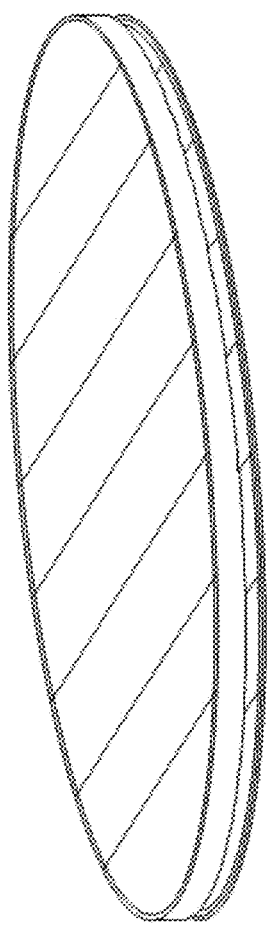
Figure 10: Backside n-Contact

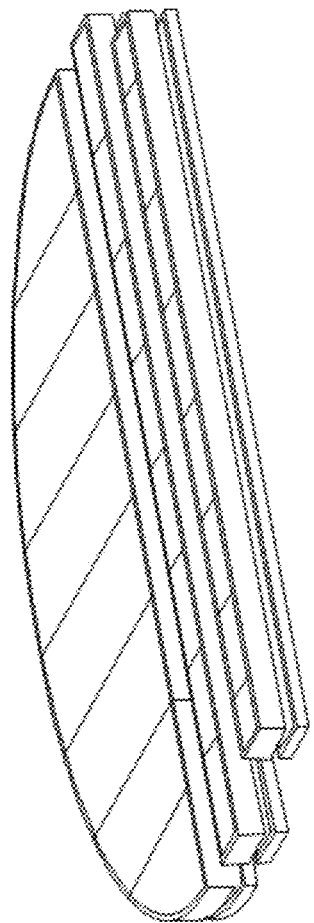
Figure 11: Scribe and Break

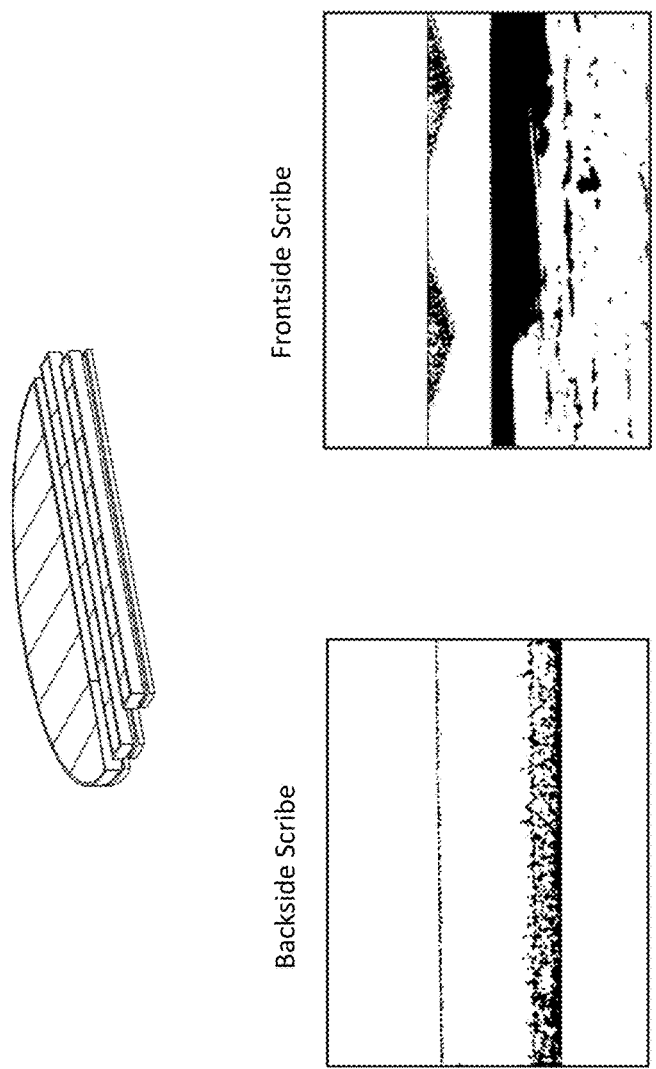
Figure 12: Scribe and Break

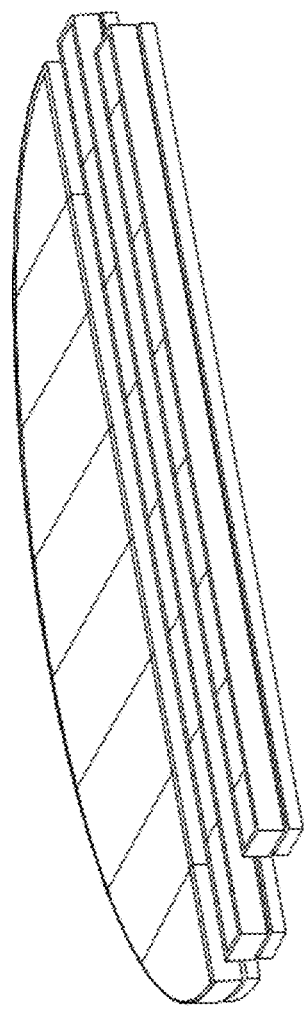
Figure 13: Scribe and Break

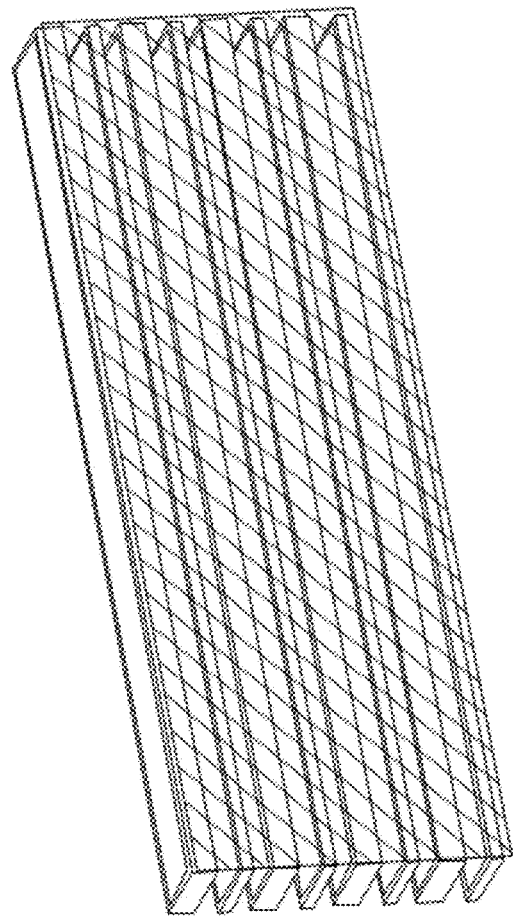
Figure 14: Stack and Coat Bars

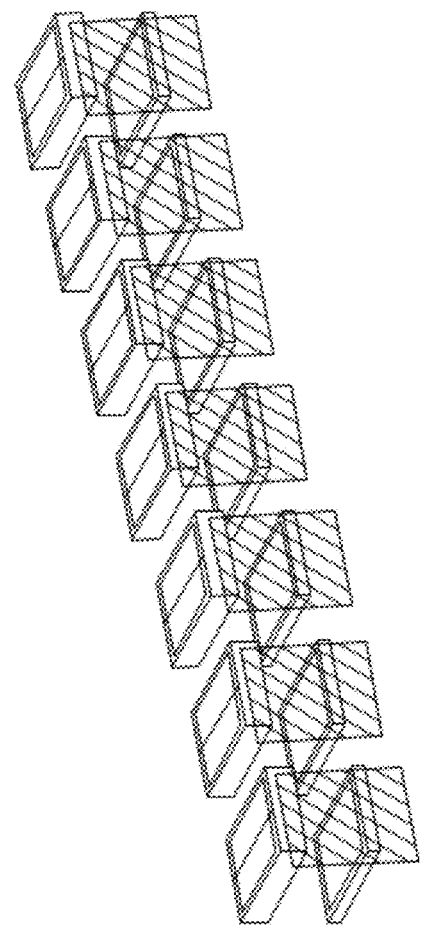
Figure 15: Singulate Bars into Die

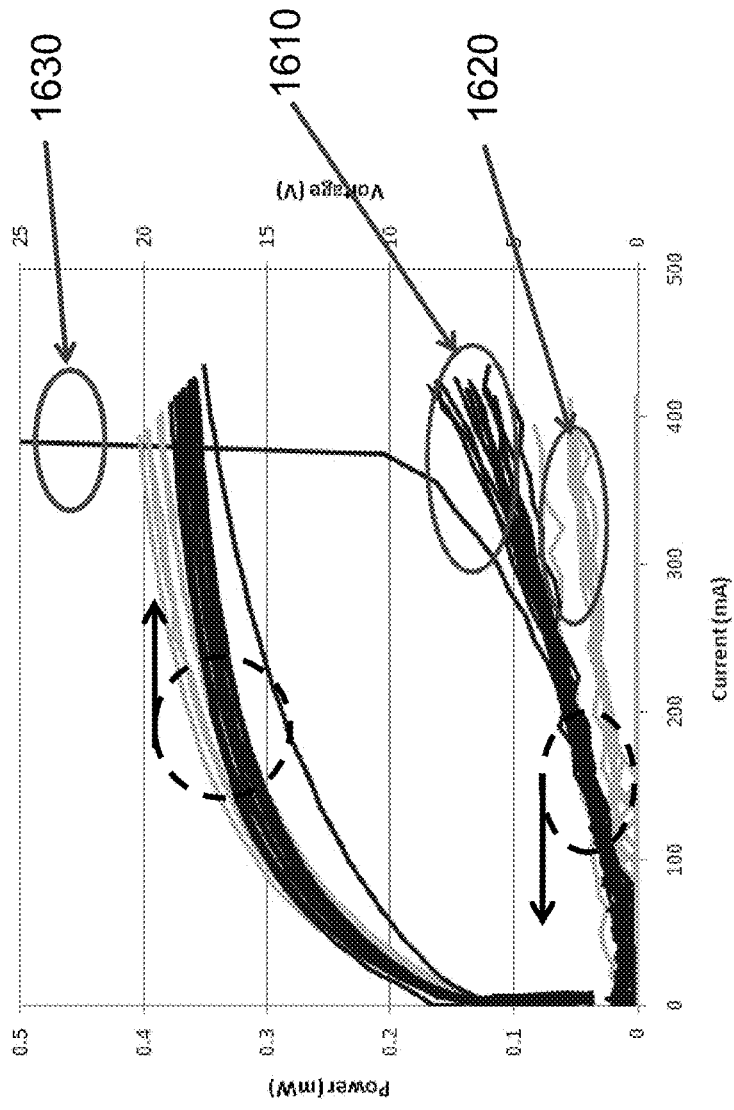
Figure 16: Light Output and Voltage Characteristics of Uncoated Lasers on {20-21}

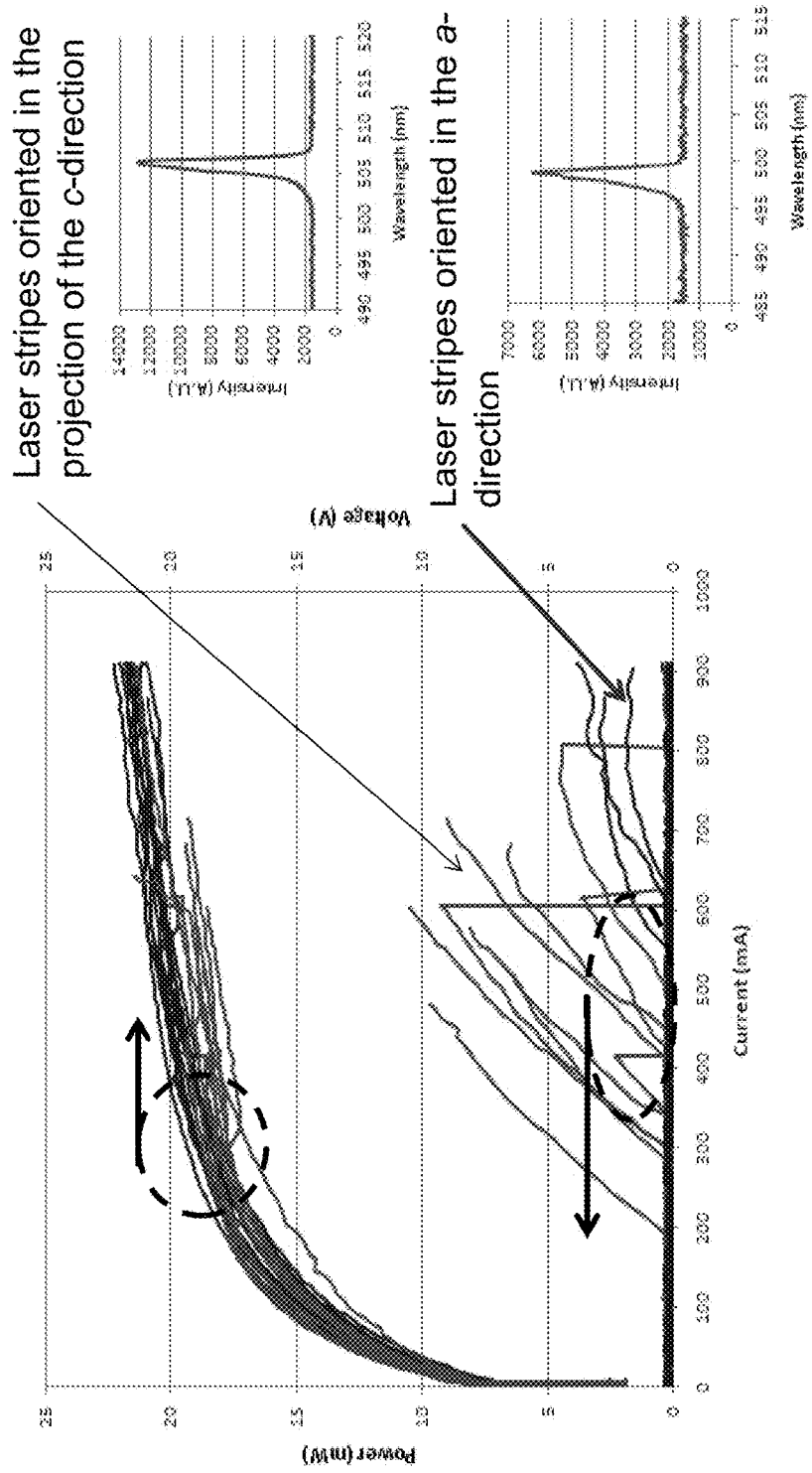
Figure 17: Light Output and Voltage Characteristics of HR Coated Lasers on {20-21}

Figure 18 Pulsed 515nm (20-21) Ridge Laser Diode
- Spectra
  - Peak = +515nm
  - FWHM = 1.4nm
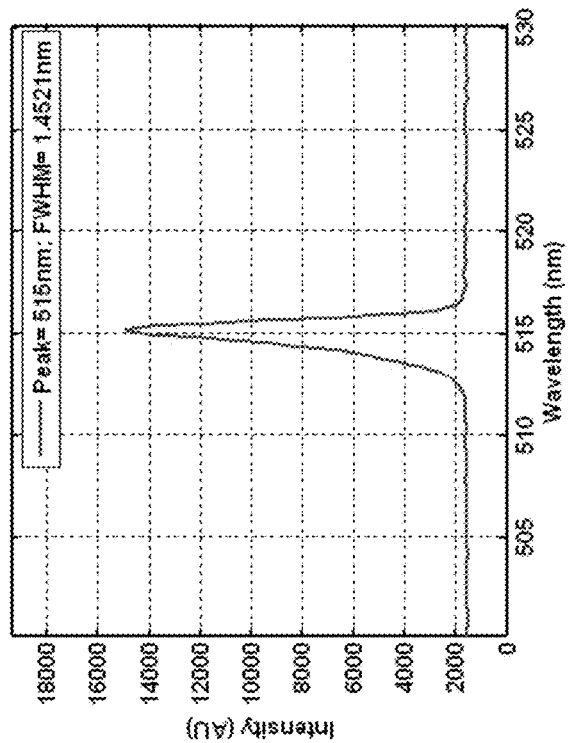
- LIV
  - Ith = 330mA
  - 17.4 kA/cm2
  - 6mW power
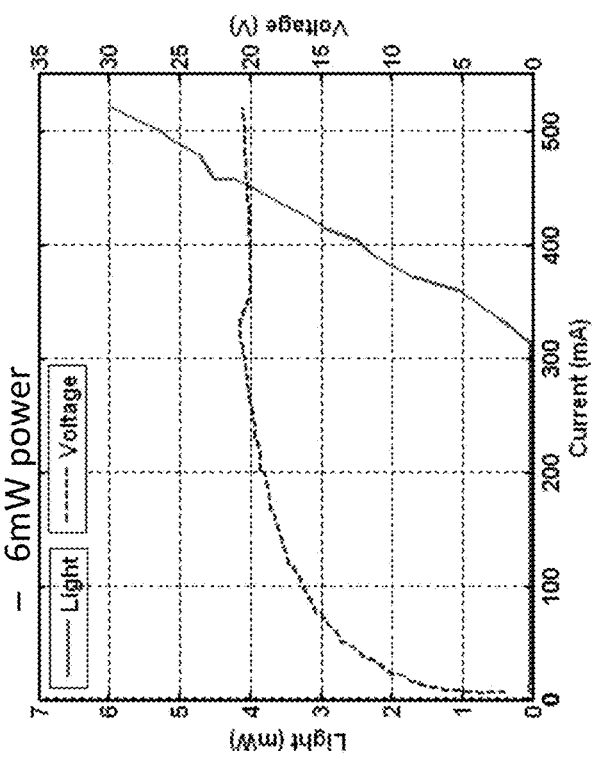

Figure 19: Continuous Wave 525nm LD on (20-21)
- CW LIV Performance
  - Ith = 138mA, Vth = 10V
  - +6.5mW power
  - WPE = 0.25%
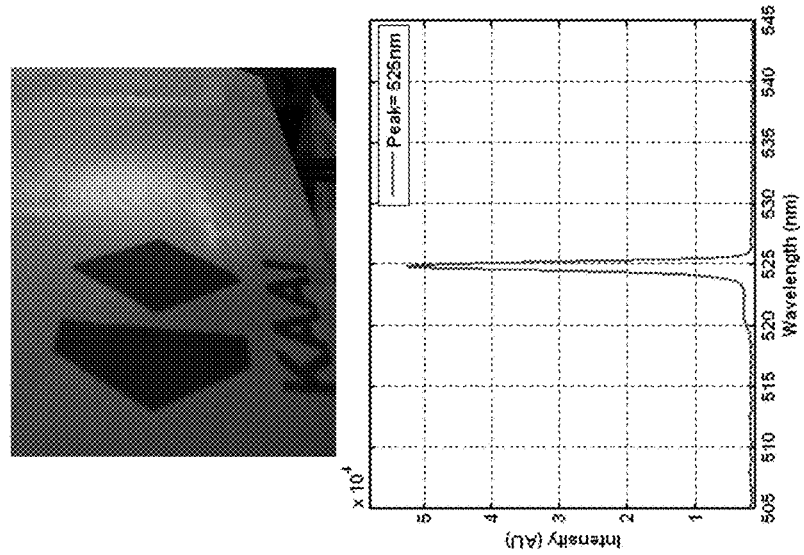
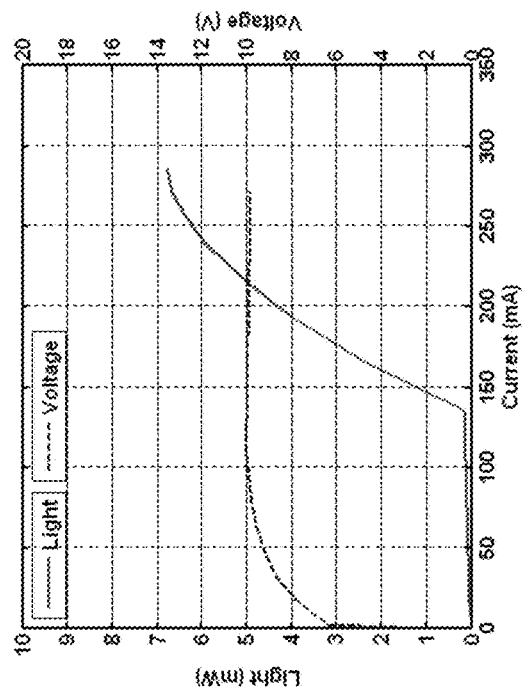

Figure 20: Continuous Wave 45mW LD on (20-21)
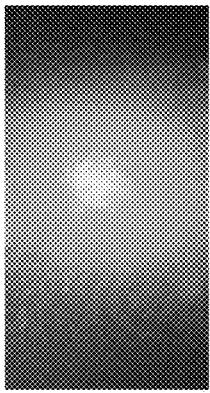
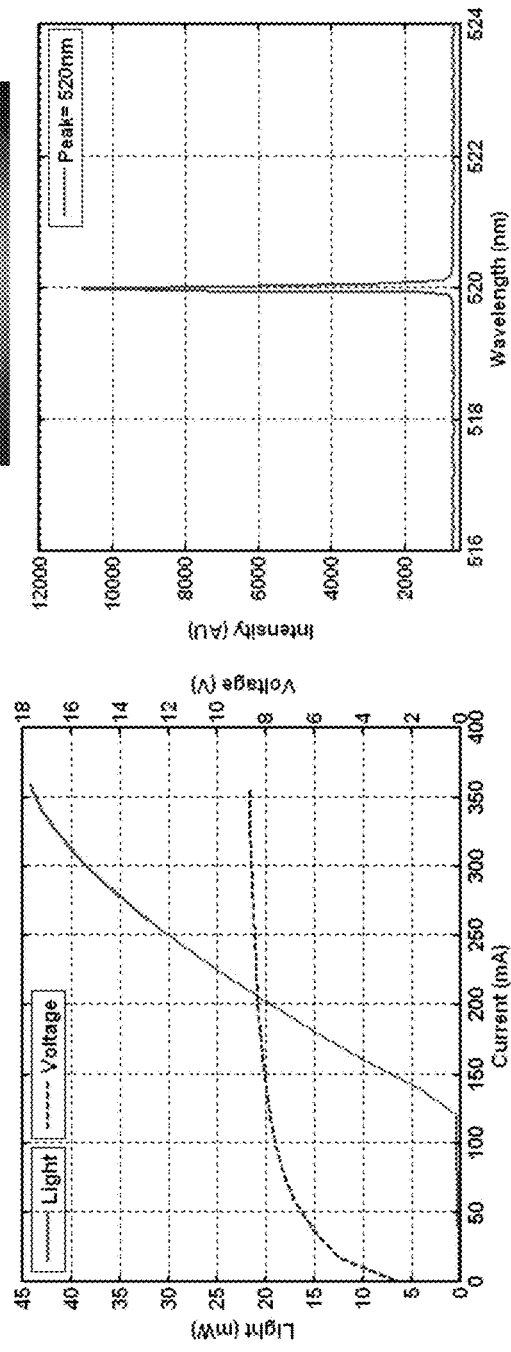
- LIV Performance
  - Ith = 120mA, Vth <8V
  - 45mW power
  - SE = 0.23 W/A
  - WPE = 1.5%

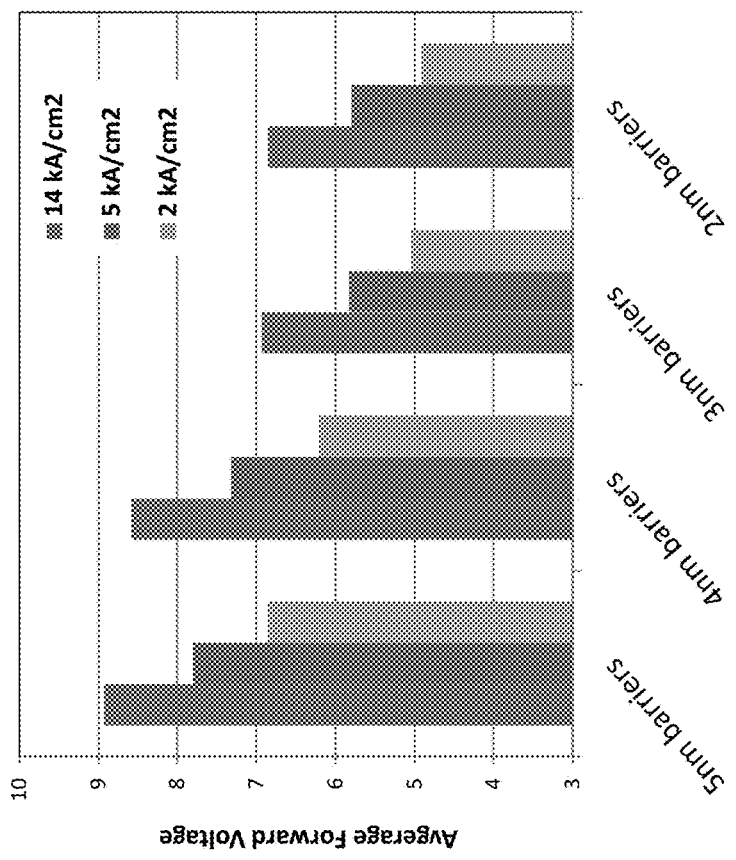
Figure 21: Forward Voltage in micro-LEDs Fabricated from Full Laser Epitaxy

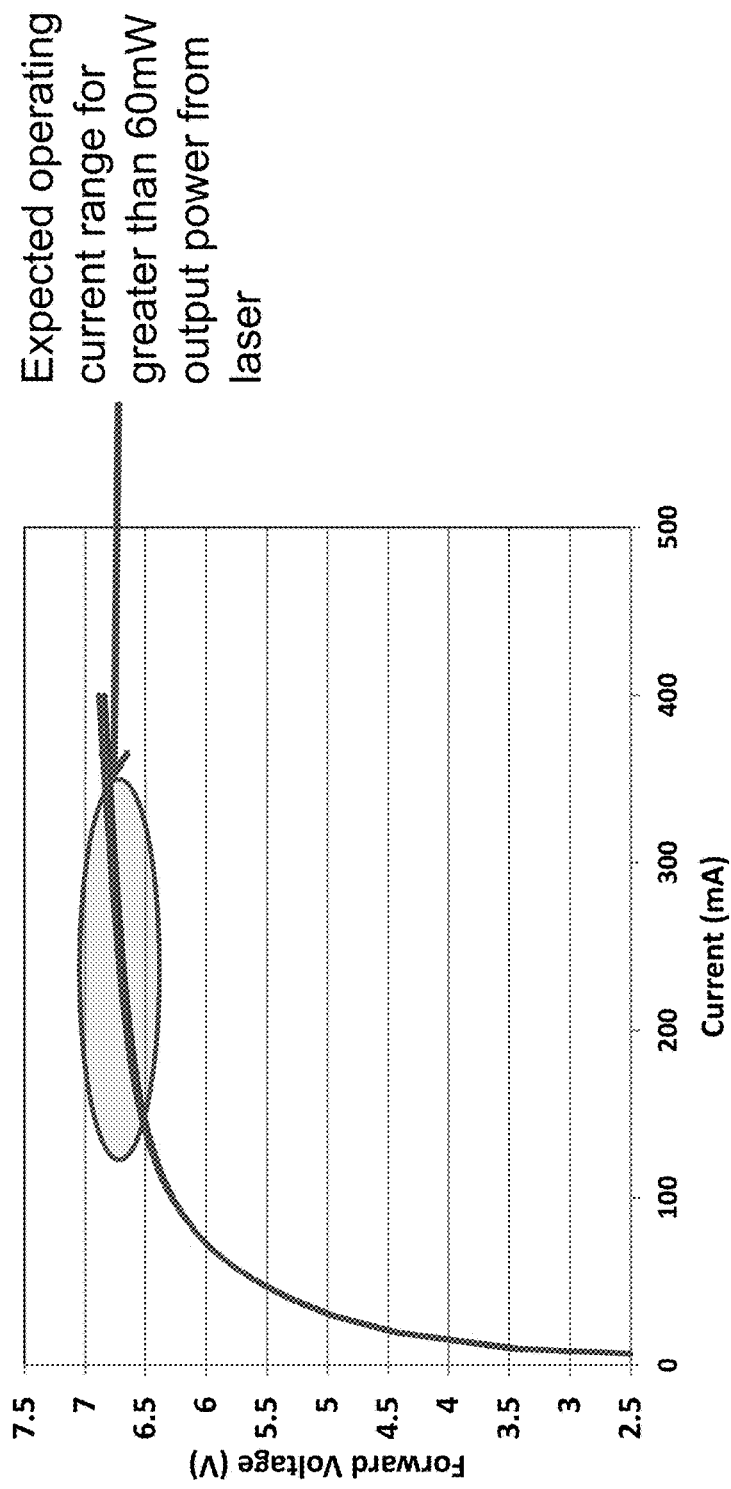
Figure 22: Voltage versus current characteristic from thin barrier {20-21} laser diode

LOW VOLTAGE LASER DIODES ON {20-21} GALLIUM AND NITROGEN CONTAINING SUBSTRATES

CROSS-REFERENCE TO RELATED APPLICATIONS

This application is a continuation application of U.S. patent application Ser. No. 15/820,047, filed Nov. 21, 2017, which is a continuation application of U.S. patent application Ser. No. 15/363,756, filed Nov. 29, 2016, which is a divisional of U.S. patent application Ser. No. 12/883,652, filed Sep. 16, 2010, which is a continuation-in-part of U.S. patent application Ser. No. 12/883,093, filed Sep. 15, 2010, now U.S. Pat. No. 8,355,418, issued, Jan. 15, 2013, which claims benefit of U.S. Provisional Patent Application No. 61/249,568, filed Oct. 7, 2009, and U.S. Provisional Application No. 61/243,502, filed Sep. 17, 2009, each commonly assigned, and each hereby incorporated by reference herein for all purposes.

BACKGROUND OF THE INVENTION

This invention is directed to optical devices and related methods. In particular, the present invention provides a method and device for emitting electromagnetic radiation using nonpolar or semipolar gallium containing substrates such as GaN, AlN, InN, InGaN, AlGaN, and AlInGaN, and others. More particularly, the present invention provides a method and device using a gallium and nitrogen containing substrate configured on the {20-21} family of planes or an off-cut of the {20-21} family of planes towards the c-plane and/or towards the a-plane. Still more particularly, the present invention provides a low voltage laser device using a gallium and nitrogen bearing species. Merely by way of example, the invention can be applied to optical devices, lasers, light emitting diodes, solar cells, photoelectrochemical water splitting and hydrogen generation, photodetectors, integrated circuits, and transistors, among other devices.

In the late 1800's, Thomas Edison invented the light bulb. The conventional light bulb, commonly called the "Edison bulb," has been used for over one hundred years for a variety of applications including lighting and displays. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light or displays. Unfortunately, drawbacks exist with the conventional Edison light bulb. The conventional light bulb dissipates more than 90% of the electrical energy it receives as thermal energy. Further, because the conventional light bulb routinely fails due to thermal expansion and contraction of the filament element, reliability is an issue. In addition, light bulbs emit light over a broad spectrum, much of which does not result in bright illumination due to the spectral sensitivity of the human eye. Also, light bulbs emit light in all directions, and thus are not ideal for applications requiring strong directionality or focus, such as projection displays, optical data storage, or specialized directed lighting.

In 1960, the laser was first demonstrated by Theodore H. Maiman at Hughes Research Laboratories in Malibu. This laser utilized a solid-state flash lamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produce laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was less than 0.1%, and the size, weight, and cost of the lasers were also undesirable.

As laser technology evolved, more efficient lamp pumped solid state laser designs were developed for the red and infrared wavelengths, but these technologies remained a challenge for blue and green and blue lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal which lases at 1064 nm, 1064 nm goes into frequency conversion crystal which converts to visible 532 nm. The DPSS laser technology extended the life and improved the wall plug efficiency of the LPSS lasers to 5-10%, and further commercialization ensue into more high end specialty industrial, medical, and scientific applications. However, the change to diode pumping increased the system cost and required precise temperature controls, leaving the laser with substantial size, power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging today. Additionally, while the diode-SHG lasers have the benefit of being directly modulate-able, they suffer from severe sensitivity to temperature which limits their application From the above, it is seen that techniques for improving optical devices is highly desired.

SUMMARY OF THE INVENTION

This invention is directed to optical devices and related methods. In particular, the present invention provides a method and device for emitting electromagnetic radiation using nonpolar or semipolar gallium containing substrates such as GaN, AlN, InN, InGaN, AlGaN, and AlInGaN, and others. More particularly, the present invention provides a method and device using a gallium and nitrogen containing substrate configured on the {20-21} family of planes or an off-cut of the {20-21} family of planes towards the c-plane and/or towards the a-plane. Still more particularly, the present invention provides a low voltage laser device using a gallium and nitrogen bearing species. Merely by way of example, the invention can be applied to optical devices, lasers, light emitting diodes, solar cells, photoelectrochemical water splitting and hydrogen generation, photodetectors, integrated circuits, and transistors, among other devices.

In preferred embodiments, the invention provides a laser structure without an aluminum bearing cladding region. In a specific embodiment, the laser device comprises a multi-quantum well active region having thin barrier layers, with the active region comprising three or more quantum well structures. Between each of the quantum well structures is a thin barrier layer, e.g., 8 nm and less, 7 nm and less, 6 nm and less, 5 nm and less, 4 nm and less, 3 nm and less, 2 nm and less, 1.5 nm and less. In a preferred embodiment, the combination of thin barrier layers configured in the multi-quantum well structures enables a low voltage (e.g., 7 volts and less, 6 volts and less) laser diode free from use of aluminum bearing cladding regions.

In one embodiment, the optical device has a gallium and nitrogen containing substrate including a {20-21} crystalline surface region orientation, which may be off-cut. The device preferably has an n-type cladding material overlying the n-type gallium and nitrogen containing material according to a specific embodiment. The n-type cladding material is substantially free from an aluminum bearing material. The device also has an active region comprising at least three quantum wells. Each of the quantum wells has a thickness of 2.5 nm and greater or 3.5 nm and greater and one or more barrier layers. Each of the barrier layers has a thickness ranging from about 2 nm to about 4 nm or about 3 nm to about 6.5 nm and is configured between a pair of quantum wells according to a specific embodiment. At least one or each of the barrier layers has a thickness ranging from about 2 nm to about 4 nm and is configured between a pair of quantum wells or adjacent to a quantum well according to a specific embodiment. At least one or each of the barrier layers has a thickness ranging from about 3 nm to about 6.5 nm and is configured between a pair of quantum wells or adjacent to a quantum well according to a specific embodiment. Preferably, the device has a p-type cladding material overlying the active region. Preferably, the p-type cladding material is substantially free from an aluminum bearing material according to a specific embodiment. In a preferred embodiment, the active region is configured operably for a forward voltage of less than about 7V or less than about 6V for the device for an output power of 60 mW and greater.

In yet an alternative embodiment, the present invention provides an optical device. The device has a gallium and nitrogen containing substrate including a {20-21} crystalline surface region orientation. The device also has an n-type cladding material overlying the n-type gallium and nitrogen containing material. The n-type cladding material is substantially free from an aluminum bearing material. The device further has an active region comprising at least two quantum wells. Each of the quantum wells has a thickness of 2.5 nm and greater or 3.5 nm and greater and one or more barrier layers according to a specific embodiment. Each of the barrier layers has a thickness ranging from about 2 nm to about 5 nm or about 3 nm to about 8 nm according to a specific embodiment. Each of the barrier layers is configured between a pair of quantum wells according to one or more embodiments. At least one or each of the barrier layers has a thickness ranging from about 2 nm to about 5 nm and is configured between a pair of quantum wells or adjacent to a quantum well according to a specific embodiment. At least one or each of the barrier layers has a thickness ranging from about 3 nm to about 8 nm and is configured between a pair of quantum wells or adjacent to a quantum well according to a specific embodiment. The device also has a p-type cladding material overlying the active region. The p-type cladding material is substantially free from an aluminum bearing material according to a preferred embodiment. The device optionally has a p-type material overlying the p-type cladding material.

In other embodiments, the invention provides yet an alternative optical device, which has a gallium and nitrogen containing substrate including a {20-21} crystalline surface region orientation. An n-type cladding material is overlying the n-type gallium and nitrogen containing material. Preferably, the n-type cladding material is substantially free from an aluminum bearing material. The device has an active region comprising at least two quantum wells, each of which has a thickness of 2.5 nm and greater. The device has one or more barrier layers, each of which has an n-type impurity characteristic and a thickness ranging from about 2 nm to about 5 nm or about 3 nm to about 8 nm in one or more alternative embodiments. Preferably, each of the barrier layers is configured between a pair of quantum wells according to a specific embodiment. The device also has a p-type cladding material overlying the active region according to a specific embodiment. The p-type cladding material is substantially free from an aluminum bearing material according to a specific embodiment. The device also has a p-type material overlying the p-type cladding material.

In other embodiments, the invention provides a method of fabricating an optical device, which has a gallium and nitrogen containing substrate including a {20-21} crystalline surface region orientation. An n-type cladding material is overlying the n-type gallium and nitrogen containing material. Preferably, the n-type cladding material is substantially free from an aluminum bearing material. The method includes forming an active region comprising at least two quantum wells, each of which has a thickness of 2.5 nm and greater. The device has one or more barrier layers, each of which has an n-type impurity characteristic and a thickness ranging from about 2 nm to about 5 nm or about 3 nm to about 8 nm in one or more alternative embodiments. Preferably, each of the barrier layers is configured between a pair of quantum wells according to a specific embodiment. The method also includes forming a p-type cladding material overlying the active region according to a specific embodiment. The p-type cladding material is substantially free from an aluminum bearing material according to a specific embodiment. The method also includes forming a p-type material overlying the p-type cladding material.

In a specific embodiment, the present invention provides an optical device, such as a laser diode. The device has a gallium and nitrogen containing substrate including a {20-21} crystalline surface region orientation, which may be off-cut according to one or more embodiments. The device has an n-type cladding material overlying the n-type gallium and nitrogen containing material. In a preferred embodiment, the n-type cladding material is substantially free from an aluminum bearing material. The device also has an active region comprising at least two quantum wells. In a specific embodiment, each of the quantum wells has a thickness of 2.5 nm and greater and one or more barrier layers according to a specific embodiment. Each of the barrier layers has a p-type characteristic and a thickness ranging from about 2 nm to about 3.5 nm in a specific embodiment. Each of the barrier layers has a p-type characteristic and a thickness ranging from about 3.5 nm to about 7 nm in an alternative specific embodiment. In a preferred embodiment, each of the barrier layers is configured between a pair of quantum wells. The device also has a p-type cladding material overlying the active region. Preferably, the p-type cladding material is substantially free from an aluminum bearing material. And overlying p-type material is included. In a preferred embodiment, the active region is configured for a forward voltage of less than about 6V or less than about 7V for the device for an output power of 60 mW and greater.

In one or more embodiments, the present invention includes a laser diode substantially free from an aluminum containing cladding region. To form the laser diode without an aluminum containing cladding region, the present laser diode includes three or more quantum wells to provide enough confinement of the optical mode for sufficient gain to reach lasing. However, when the number of quantum wells increases in the active region, the forward voltage of the diode can increase, as a tradeoff. We have determined that the forward voltage of the diode can be reduced in multi-quantum well active regions by way of the use of thin barriers on the order of 5 nm, which are much thinner than conventional lasers such as those in Yoshizumi et al., "Continuous-Wave operation of 520 nm Green InGaN-Based Laser Diodes on Semi-Polar {20-21} GaN Substrates," Applied Physics Express 2 (2009) 092101. We have also determined that the forward voltage can be reduced in multi-quantum well active regions by adding p or n-type dopant species to the active region according to one or more other embodiments. Although any one or combination of these approached can be used, we believe it would be preferable to use the thin barrier approach to avoid adding impurities to the active region. The impurities may change optical losses and alter the electrical junction placement according to one or more embodiments. Accordingly, the present invention provides a laser device and method that is free from aluminum-containing cladding regions with low voltage on {20-21} substrates.

Moreover, the present invention provides an optical device that is substantially free from aluminum bearing cladding materials. The device has a gallium and nitrogen containing substrate member having a {20-21} crystalline surface region. The device has an n-type gallium and nitrogen containing cladding material. In a specific embodiment, the n-type gallium and nitrogen containing cladding material is substantially free from an aluminum species, which leads to imperfections, defects, and other limitations. The device also has an active region including multiple quantum well structures overlying the n-type gallium and nitrogen containing cladding material. In one or more preferred embodiments, the device also has thin barrier layers configured with the multiple well structures. The device has a p-type gallium and nitrogen containing cladding material overlying the active region. In a preferred embodiment, the p-type gallium and nitrogen containing cladding material is substantially free from an aluminum species. The device preferably includes a laser stripe region configured from at least the active region and characterized by a cavity orientation substantially parallel to a projection in a c-direction. The laser strip region has a first end and a second end. The device also has a first cleaved facet provided on the first end of the laser stripe region and a second cleaved facet provided on the second end of the laser stripe region. In yet other embodiments, the present device includes a gallium and nitrogen containing electron blocking region that is substantially free from aluminum species. In yet other embodiments, the device does not include any electron blocking layer or yet in other embodiments, there is no aluminum in the cladding layers and/or electron blocking layer, although other embodiments include aluminum containing blocking layers. In still other embodiments, the optical device and method are free from any aluminum material, which leads to defects, imperfections, and the like.

In preferred embodiments, the present method and structure is substantially free from InAlGaN or aluminum bearing species in the cladding layers as conventional techniques, such as those in Yoshizumi et al., "Continuous-Wave operation of 520 nm Green InGaN-Based Laser Diodes on Semi-Polar {20-21} GaN Substrates," Applied Physics Express 2 (2009) 092101. That is, the present laser structure and method are substantially free from any aluminum species in the cladding region. Aluminum is generally detrimental. Aluminum often leads to introduction of oxygen in the reactor, which can act as non-radiative recombination centers to reduce the radiative efficiency and introduce other limitations. We also determined that oxygen can compensate p-type dopants in the p-cladding to cause additional resistivity in the optical device. In other aspects, we also determined that aluminum is detrimental to the MOCVD reactor and can react or pre-react with other growth precursors. Use of aluminum cladding layers is also cumbersome and can take additional time to grow. Accordingly, it is believed that the aluminum cladding free laser method and structure are generally more efficient to grow than conventional laser structures.

Additional benefits are achieved over pre-existing techniques using the present invention. In particular, the present invention enables a cost-effective optical device for laser applications. In a specific embodiment, the present optical device can be manufactured in a relatively simple and cost effective manner. Depending upon the embodiment, the present apparatus and method can be manufactured using conventional materials and/or methods according to one of ordinary skill in the art. The present laser device uses a semipolar gallium nitride material capable of achieve a green laser device, among others. In one or more embodiments, the laser device is capable of emitting long wavelengths such as those ranging from about 500 nm to greater than about 540 nm, but can be others. In another embodiment the laser device is capable of operating in the blue region of 430 nm to 480 nm or the cyan region of 480 nm to about 500 nm. In yet another embodiment, the laser device is capable of operating in the violet region of 390 nm to 430 nm. In one or more preferred embodiments, the present invention provides a laser diode on a {20-21} gallium and nitrogen containing material configured for emissions at about 522 nm and greater, but can be others. In a specific embodiment, the present method and structure uses a top-side skip and scribe technique for improved cleaves in the laser device structure. In one or more embodiments, the present invention provides a method using a top side skip-scribe technique for good facets in the projection of the c-direction. In a preferred embodiment, the present device and method provide a laser device configured on a gallium and nitrogen containing substrate having thin barrier regions within the active region, and having a forward voltage of 7V and less, which is desirable.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIG. 3 is a simplified diagram illustrating an epitaxial laser structure according to an embodiment of the present invention.

FIGS. 3A through 3C are simplified diagrams illustrating epitaxial laser structures according to other embodiments of the present invention.

FIGS. 4 and 5 are photographs of cleaved facets for the device of FIG. 1 according to one or more embodiments of the present invention.

FIG. 6 is a simplified perspective view of an alternative laser device fabricated on a gallium and nitrogen containing substrate according to an embodiment of the present invention.

FIG. 7 is a photograph of cleaved facets for the device of FIG. 6 according to one or more embodiments of the present invention.

FIGS. 8 to 15 illustrate a simplified backend processing method of a laser device according to one or more embodiments of the present invention.

FIG. 16 is a simplified plot illustrating light output voltage characteristics of laser stripes according to an embodiment of the present invention.

FIG. 17 is a simplified plot illustrating light output voltage characteristics of laser stripes according to a preferred embodiment of the present invention.

FIG. 18 is a simplified plot of voltage and light characteristics of a 522 nm laser device according to an embodiment of the present invention.

FIG. 19 is a simplified plot of voltage and light characteristics of a continuous wave 525 nm laser device according to an embodiment of the present invention.

FIG. 20 is a simplified plot of voltage and light characteristics of a continuous wave 520 nm laser device operable at 45 mWatts according to an embodiment of the present invention.

FIG. 21 is a simplified diagram of forward voltage at three difference current densities for micro-LED devices fabricated from 5 quantum well laser diode epitaxial structures with various barrier thicknesses.

FIG. 22 is a simplified diagram of voltage versus current characteristic from single lateral mode green laser diode with ~600 micron cavity length according to a specific embodiment.

DETAILED DESCRIPTION OF THE INVENTION

Figure 1:
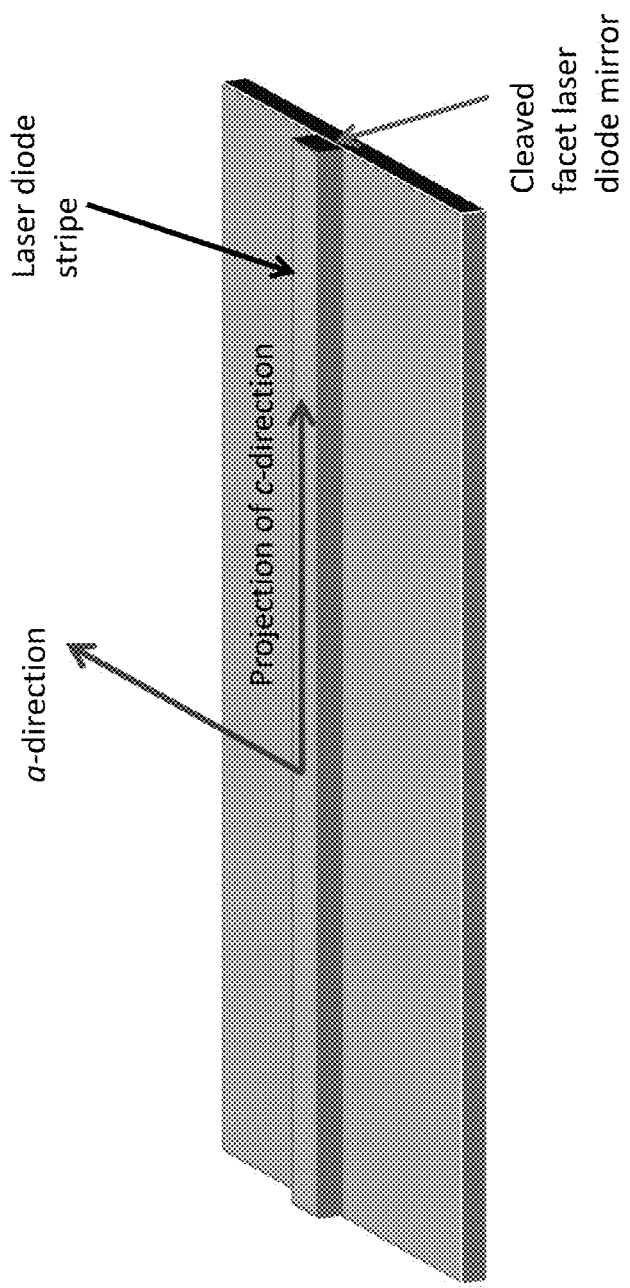
FIG. 1 is a simplified perspective view of a laser device fabricated on the {20-21} plane gallium and nitrogen containing substrate according to an embodiment of the present invention.

According to the present invention, techniques related generally to optical devices are provided. In particular, the present invention provides a method and device for emitting electromagnetic radiation using nonpolar or semipolar gallium containing substrates such as GaN, AlN, InN, InGaN, AlGaN, and AlInGaN, and others. More particularly, the present invention provides a method and device using a gallium and nitrogen containing {20-21} substrate which could be miscut towards the c-plane or towards the a-plane according to one or more embodiments, but there can be other configurations. Still more particularly, the present invention provides a low voltage laser device using a gallium and nitrogen bearing species. Merely by way of example, the invention can be applied to optical devices, lasers, light emitting diodes, solar cells, photoelectrochemical water splitting and hydrogen generation, photodetectors, integrated circuits, and transistors, among other devices. In a specific embodiment, the present laser device can be employed in either a semipolar or non-polar gallium containing substrate, as described below.

We have explored epitaxial growth and cleave properties on semipolar crystal planes oriented between the nonpolar m-plane and the polar c-plane. In particular, we have grown on the {30-31} and {20-21} families of crystal planes. We have achieved promising epitaxy structures and cleaves that will create a path to efficient laser diodes operating at wavelengths from about 400 nm to green, e.g., 500 nm to 540 nm. These results include bright blue epitaxy in the 450 nm range, bright green epitaxy in the 520 nm range, and smooth naturally occurring cleave planes orthogonal to the projection of the c-direction. It is desirable to align the laser cavities parallel to the projection of the c-direction for maximum gain on this family of crystal planes. Using these technologies, we have demonstrated a laser device on {20-21} operating at 522 nm with a cavity oriented in the projection of the c-direction, but can be others.

Although it was believed that a higher gain would be offered in the projection of the c-direction than would be available in the a-direction, it is also desirable to form a high quality cleavage plane orthogonal to a stripe oriented in the projection of the c-direction. An example of such a laser device is described in U.S. Ser. No. 61/243,502 filed Sep. 17, 2009, entitled "Growth Structures and Methods for Forming Laser Diodes on {20-21} or Off Cut Gallium and Nitrogen Containing Substrates," and in U.S. Ser. No. 12/884,993, entitled, "Growth Structures and Method for Forming Laser Diodes on {20-21} or Off Cut Gallium and Nitrogen Containing Substrates." More specifically, we desired a high quality cleavage plane orthogonal to the [10-1-7] for a laser stripe formed on the {20-21} plane. In one or more preferred embodiments, we determined a high quality cleave plane substantially orthogonal to the projection of the c-direction, [10-1-7]. In particular, we determined that if a top side skip-scribe scribing technique is used followed by a break step a high quality smooth and vertical cleaved facet would be formed on the upper portion of the cleave face according to one or more embodiments. Below the upper portion of the cleave face the facet becomes angled, which may not be optimum for a laser diode mirror according to one or more embodiments. In other embodiments, however, such angled cleave characteristic is desirable for laser fabrication since the laser mirror will be positioned on top of the substrate where the cleave face is vertical. In one or more embodiments, when the sample is back side laser scribed and then broken, an angled, but smooth cleave face is formed. Such a smooth cleave face may be desirable for lasers, but it is not the most preferable since the laser mirror will be tilted. The top-side skip scribe technique looks more preferably according to one or more embodiments. Further details of the scribing and breaking technique can be found throughout the present specification and more particularly below.

FIG. 1 is a simplified perspective view of a laser device 100 fabricated on an off-cut m-plane {20-21} substrate according to an embodiment of the present invention. This diagram is merely an example, which should not unduly limit the scope of the claims herein. One of ordinary skill in the art would recognize other variations, modifications, and alternatives. As shown, the optical device includes a gallium nitride substrate member 101 having the off-cut m-plane crystalline surface region. In a specific embodiment, the gallium nitride substrate member is a bulk GaN substrate characterized by having a semipolar or non-polar crystalline surface region, but can be others. In a specific embodiment, the bulk nitride GaN substrate comprises nitrogen and has a surface dislocation density below $10^5$ cm$^{-2}$. The nitride crystal or wafer may comprise $Al_xIn_yGa_{1-x-y}N$, where $0 \leq x$, y, $x+y \leq 1$. In one specific embodiment, the nitride crystal comprises GaN, but can be others. In one or more embodiments, the GaN substrate has threading dislocations, at a concentration between about $10^5$ cm$^{-2}$ and about $10^8$ cm$^{-2}$, in a direction that is substantially orthogonal or oblique with respect to the surface. As a consequence of the orthogonal or oblique orientation of the dislocations, the surface dislocation density is between about $10^5$ cm$^{-2}$ to 10 cm$^{-2}$ or below about $10^5$ cm$^{-2}$. In a specific embodiment, the device can be fabricated on a slightly off-cut semipolar substrate as described in U.S. Ser. No. 12/749,466 filed Mar. 29, 2010, which claims priority to U.S. Provisional No. 61/164,409 filed Mar. 28, 2009, commonly assigned, and hereby incorporated by reference herein.

In a specific embodiment on the {20-21} GaN, the device has a laser stripe region formed overlying a portion of the off-cut crystalline orientation surface region. In a specific embodiment, the laser stripe region is characterized by a cavity orientation substantially in a projection of a c-direction, which is substantially normal to an a-direction. In a specific embodiment, the laser strip region has a first end 107 and a second end 109. In a preferred embodiment, the device is formed on a projection of a c-direction on a {20-21} gallium and nitrogen containing substrate having a pair of cleaved mirror structures, which face each other.

In a preferred embodiment, the device has a first cleaved facet provided on the first end of the laser stripe region and a second cleaved facet provided on the second end of the laser stripe region. In one or more embodiments, the first cleaved is substantially parallel with the second cleaved facet. Mirror surfaces are formed on each of the cleaved surfaces. The first cleaved facet comprises a first mirror surface. In a preferred embodiment, the first mirror surface is provided by a top-side skip-scribe scribing and breaking process. The scribing process can use any suitable techniques, such as a diamond scribe or laser scribe or combinations. In a specific embodiment, the first mirror surface comprises a reflective coating. The reflective coating is selected from silicon dioxide, hafnia, and titania, tantalum pentoxide, zirconia, including combinations, and the like. Depending upon the embodiment, the first mirror surface can also comprise an anti-reflective coating.

Also in a preferred embodiment, the second cleaved facet comprises a second mirror surface. The second mirror surface is provided by a top side skip-scribe scribing and breaking process according to a specific embodiment. Preferably, the scribing is diamond scribed or laser scribed or the like. In a specific embodiment, the second mirror surface comprises a reflective coating, such as silicon dioxide, hafnia, and titania, tantalum pentoxide, zirconia, combinations, and the like. In a specific embodiment, the second mirror surface comprises an anti-reflective coating.

In a specific embodiment, the laser stripe has a length and width. The length ranges from about 50 microns to about 3000 microns or preferably from about 400 microns to about 650 microns or about 650 microns to about 1200 um microns. The strip also has a width ranging from about 0.5 microns to about 50 microns or preferably between 1 microns to about 1.5 microns, about 1.5 microns to about 2.0 microns, or about 2.0 microns to about 4 microns, but can be other dimensions. In a specific embodiment, the width is substantially constant in dimension, although there may be slight variations. The width and length are often formed using a masking and etching process, which are commonly used in the art.

In a specific embodiment, the present invention provides an alternative device structure capable of emitting 501 nm and greater light in a ridge laser embodiment. The device is provided with one or more of the following epitaxially grown elements, but is not limiting.

an n-GaN cladding layer with a thickness from 100 nm to 3000 nm with Si doping level of 5E17 to 3E18 cm–3 an n-side SCH layer comprised of InGaN with molar fraction of indium of between 3% and 10% and thickness from 20 to 150 nm multiple quantum well active region layers comprised of at least two 2.0-5.5 nm InGaN quantum wells separated by thin 2.5 nm and greater, and optionally up to about 8 nm, GaN barriers a p-side SCH layer comprised of InGaN with molar a fraction of indium of between 1% and 10% and a thickness from 15 nm to 100 nm an electron blocking layer comprised of AlGaN with molar fraction of aluminum of between 5% and 20% and thickness from 5 nm to 20 nm and doped with Mg.

a p-GaN cladding layer with a thickness from 400 nm to 1000 nm with Mg doping level of 2E17 cm–3 to 2E19 cm–3 a p++-GaN contact layer with a thickness from 20 nm to 40 nm with Mg doping level of 1E19 cm–3 to 1E21 cm–3

Of course there can be other embodiments such as the use of p-side GaN guiding layer in place of the p-SCH, the use of multiple different layers in the SCH regions, or the omission of the EBL layer. Again, there can be other variations, modifications, and alternatives.

Figure 2:
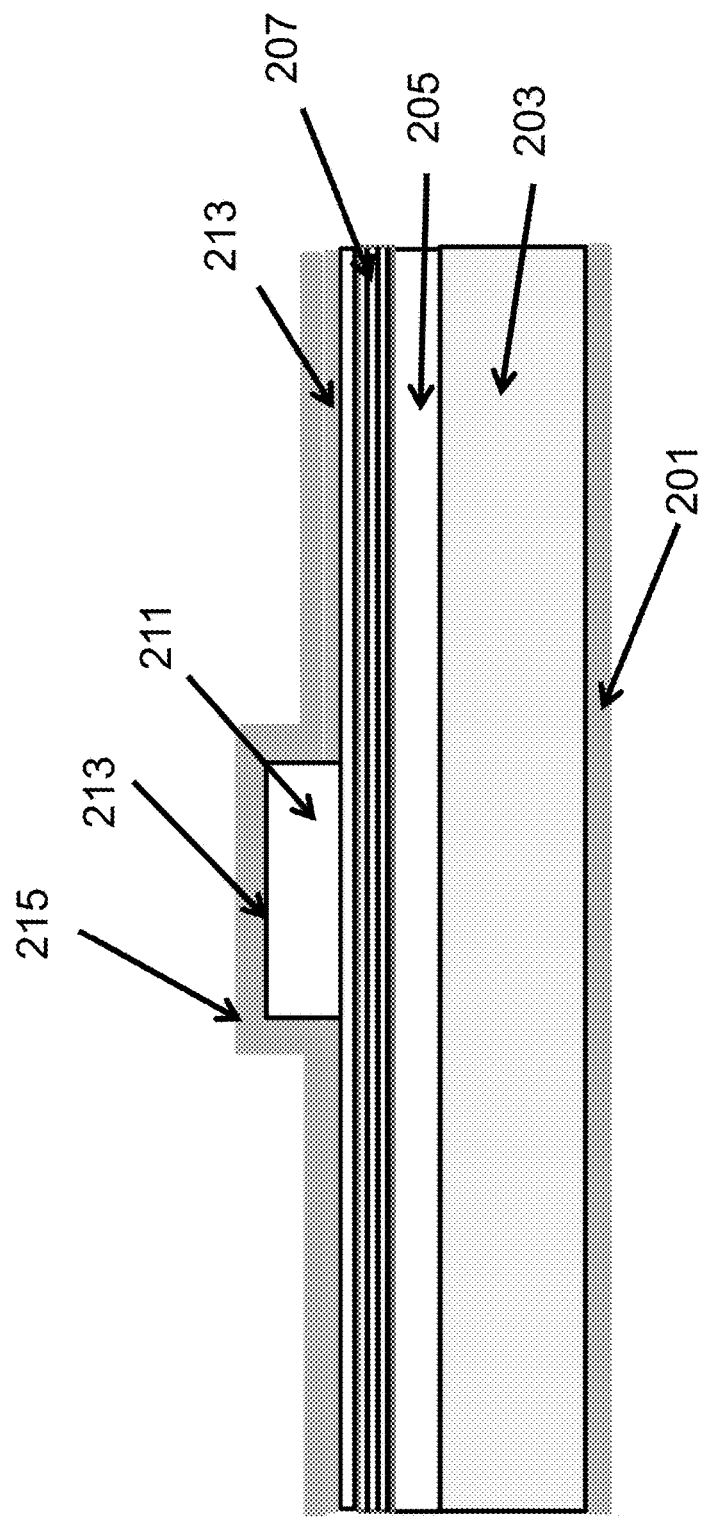
FIG. 2 is a detailed cross-sectional view of a laser device fabricated on the {20-21} plane gallium and nitrogen containing substrate according to an embodiment of the present invention.

FIG. 2 is a detailed cross-sectional view of a laser device 200 fabricated on a {20-21} substrate according to an embodiment of the present invention. This diagram is merely an example, which should not unduly limit the scope of the claims herein. One of ordinary skill in the art would recognize other variations, modifications, and alternatives. As shown, the laser device includes gallium nitride substrate 203, which has an underlying n-type metal back contact region 201. In a specific embodiment, the metal back contact region is made of a suitable material such as those noted below and others. Further details of the contact region can be found throughout the present specification, and more particularly below.

In a specific embodiment, the device also has an overlying n-type gallium nitride layer 205, an active region 207, and an overlying p-type gallium nitride layer structured as a laser stripe region 209. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ cm$^{-3}$ and $10^{20}$ cm$^{-3}$.

In a specific embodiment, an n-type $Al_uIn_vGa_{1-u-v}N$ layer, where $0 \leq u$, v, $u+v \leq 1$, is deposited on the substrate. In a specific embodiment, the carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE).

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. In one specific embodiment, the susceptor is heated to approximately 900 to 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 and 10 sccm, is initiated.

In a specific embodiment, the laser stripe region is made of the p-type gallium nitride layer 209. In a specific embodiment, the laser stripe is provided by an etching process selected from dry etching or wet etching. In a preferred embodiment, the etching process is dry, but can be others. As an example, the dry etching process is an inductively coupled process using chlorine bearing species or a reactive ion etching process using similar chemistries. Again as an example, the chlorine bearing species are commonly derived from chlorine gas or the like. The device also has an overlying dielectric region, which exposes 213 contact region. In a specific embodiment, the dielectric region is an oxide such as silicon dioxide or silicon nitride, but can be others. The contact region is coupled to an overlying metal layer 215. The overlying metal layer is a multilayered structure containing gold and platinum (Pt/Au), nickel gold (Ni/Au), but can be others.

In a specific embodiment, the laser device has active region 207. The active region can include one to twenty quantum well regions according to one or more embodiments. As an example following deposition of the n-type $Al_uIn_vGa_{1-u-v}N$ layer for a predetermined period of time, so as to achieve a predetermined thickness, an active layer is deposited. The active layer may be comprised of multiple quantum wells, with 2-10 quantum wells. The quantum wells may be comprised of InGaN with GaN barrier layers separating them. In other embodiments, the well layers and barrier layers comprise $Al_wIn_xGa_{1-w-x}N$, and $Al_yIn_zGa_{1-y-z}N$, respectively, where $0 \leq w$, x, y, z, w+x, y+z $\leq 1$, where w<u, y and/or x>v, z so that the bandgap of the well layer(s) is less than that of the barrier layer(s) and the n-type layer. The well layers and barrier layers may each have a thickness between about 1 nm and about 20 nm. The composition and structure of the active layer are chosen to provide light emission at a preselected wavelength. The active layer may be left undoped (or unintentionally doped) or may be doped n-type or p-type.

In a specific embodiment, the active region can also include an electron blocking region, and a separate confinement heterostructure. In some embodiments, an electron blocking layer is preferably deposited. The electron-blocking layer may comprise $Al_sIn_tGa_{1-s-t}N$, where $0 \leq s$, t, s+t $\leq 1$, with a higher bandgap than the active layer, and may be doped p-type. In one specific embodiment, the electron blocking layer comprises AlGaN. In another embodiment, the electron blocking layer comprises an AlGaN/GaN superlattice structure, comprising alternating layers of AlGaN and GaN, each with a thickness between about 0.2 nm and about 5 nm.

In a specific embodiment, the action region structure does not include an AlGaN EBL layer. That is, the laser device is free from any electron blocking layer, which is optional in such embodiment.

As noted, the p-type gallium nitride structure is deposited above the electron blocking layer and active layer(s). The p-type layer may be doped with Mg, to a level between about $10^{16}$ cm$^{-3}$ and $10^{22}$ cm$^{-3}$, and may have a thickness between about 5 nm and about 1000 nm. The outermost 1-50 nm of the p-type layer may be doped more heavily than the rest of the layer, so as to enable an improved electrical contact. In a specific embodiment, the laser stripe is provided by an etching process selected from dry etching or wet etching. In a preferred embodiment, the etching process is dry, but can be others. The device also has an overlying dielectric region, which exposes 213 contact region. In a specific embodiment, the dielectric region is an oxide such as silicon dioxide.

In a specific embodiment, the metal contact is made of suitable material. The reflective electrical contact may comprise at least one of silver, gold, aluminum, nickel, platinum, rhodium, palladium, chromium, or the like. The electrical contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device.

FIG. 3 is a simplified diagram illustrating a laser structure according to a preferred embodiment of the present invention. This diagram is merely an example, which should not unduly limit the scope of the claims herein. FIG. 3 is an example of a laser structure having five multiple quantum well (MQW) InGaN/InGaN and/or InGaN/GaN active regions and asymmetric separate confinement hetereostructure layers (SCH). FIG. 3 shows an n-GAN cladding layer 311, an n-side InGAN SCH 321, 5 MQW InGaN/InGaN or InGaN/GaN active regions 341, p-side InGAN SCH or GaN guide 322, an AlGaN electron block layer 331, and a p-GaN cladding layer 312. One of ordinary skill in the art would recognize other variations, modifications, and alternatives. In a specific embodiment, the device includes a starting material such as a bulk nonpolar or semipolar GaN substrate, but can be others. In a specific embodiment, the device is configured to achieve emission wavelength ranges of 390 nm to 420 nm, 420 nm to 440 nm, 440 nm to 470 nm, 470 nm to 490 nm, 490 nm to 510 nm, and 510 nm to 530 nm, but can be others.

In a preferred embodiment, the growth structure is configured using between 3 and 5 or 5 and 7 quantum wells positioned between n-type GaN and p-type GaN cladding layers. In a specific embodiment, the n-type GaN cladding layer ranges in thickness from 500 nm to 2000 nm and has an n-type dopant such as Si with a doping level of between 1E18 cm−3 and 3E18 cm−3. In a specific embodiment, the p-type GaN cladding layer ranges in thickness from 500 nm to 1000 nm and has a p-type dopant such as Mg with a doping level of between 1E17 cm−3 and 7E19 cm−3. In a specific embodiment, the Mg doping level is graded such that the concentration would be lower in the region closer to the quantum wells.

In a specific preferred embodiment, the quantum wells have a thickness of between 2.5 nm and 4 nm, 4 nm and 5.5 nm or 5.5 nm and 8 nm, but can be others. In a specific embodiment, the quantum wells would be separated by barrier layers with thicknesses between 2 nm and 3.5 nm or 3.5 nm and 6 nm or 6 nm and 8 nm. The quantum wells and the barriers together comprise a multiple quantum well (MQW) region.

In a preferred embodiment, the device has barrier layers formed from GaN, InGaN, AlGaN, or InAlGaN. In a specific embodiment using InGaN barriers, the indium contents range from 0% to 5% (mole percent), but can be others. Also, it should be noted that % of indium or aluminum is in a molar fraction, not weight percent.

An InGaN separate confinement hetereostructure layer (SCH) could be positioned between the n-type GaN cladding and the MQW region according to one or more embodiments. Typically, such separate confinement layer is commonly called the n-side SCH. The n-side SCH layer ranges in thickness from 10 nm to 60 nm or 60 nm to 150 nm and ranges in indium composition from 1% to 12% (mole percent), but can be others. In a specific embodiment, the n-side SCH layer may be doped with an n-type dopant such as Si.

In yet another preferred embodiment, an InGaN separate confinement hetereostructure layer (SCH) is positioned between the p-type GaN cladding and the MQW region, which is called the p-side SCH. In a specific embodiment, the p-side SCH layer ranges in thickness from 10 nm to 40 nm or 40 nm to 150 nm and ranges in indium composition from 0% to 10% (mole percent), but can be others. The p-side SCH layer may be doped with a p-type dopant such as Mg.

In another embodiment, the structure would contain both an n-side SCH and a p-side SCH. In another embodiment the p-side SCH would be replaced with p-side GaN guiding layer. In another embodiment the n-side and/or p-side SCH regions would contain multiple layers.

In another embodiment, the structure would contain a GaN guiding layer on the p-side positioned between the p-type GaN cladding layer and the MQW region. This GaN guiding layer could range in thickness from 10 nm to 60 nm and may or may not be doped with a p-type species such as Mg.

In a specific preferred embodiment, an AlGaN electron blocking layer, with an aluminum content of between 5% and 20% (mole percent), is positioned between the MQW and the p-type GaN cladding layer either between the MQW and the p-side SCH, within the p-side SCH, or between the p-side SCH and the p-type GaN cladding. The AlGaN electron blocking layer ranges in thickness from 5 nm to 20 nm and is doped with a p-type dopant such as Mg from 1E17 cm−3 and 1E21 cm−3 according to a specific embodiment. In other embodiments, the electron blocking layer is free from any aluminum species and/or may be eliminated altogether. In yet another embodiment, the device would be substantially free from an electron blocking layer.

Preferably, a p-contact layer positioned on top of and is formed overlying the p-type cladding layer. The p-contact layer would be comprised of GaN doped with a p-dopant such as Mg at a level ranging from 1E20 cm−3 to 1E22 cm−3.

FIGS. 3A through 3C are simplified diagrams illustrating epitaxial laser structures according to other embodiments of the present invention. In a preferred embodiment, the present invention provides an optical device that is substantially free from aluminum bearing cladding materials. The device has a gallium and nitrogen containing substrate member (e.g., bulk gallium nitride) having a {20-21} crystalline surface region or other surface configuration. The device has an n-type gallium and nitrogen containing cladding material. In a specific embodiment, the n-type gallium and nitrogen containing cladding material is substantially free from an aluminum species, which leads to imperfections, impurities, and other limitations. In one or more preferred embodiment, the cladding material has no aluminum species and is made of a gallium and nitrogen containing material. Of course, there can be other variations, modification, and alternatives.

In a specific embodiment, the device also has an active region including multiple quantum well structures overlying the n-type gallium and nitrogen containing cladding material. In one or more embodiments, the active regions can include those noted, as well as others. That is, the device can include InGaN/InGaN and/or InGaN/GaN active regions, among others. In a specific embodiment, the optical device can include seven MQW, six MQW, five MQW, four MQW, three MQW, more MQW, or fewer, and the like. For example, FIG. 3A is an example of an optical device having five multiple quantum well (MQW) InGaN/InGaN and/or InGaN/GaN active regions 342 and symmetric separate confinement hetereostructure layers (SCH). FIG. 3B is an example of an optical device having seven multiple quantum well (MQW) InGaN/InGaN and/or InGaN/GaN active regions 343 and symmetric separate confinement hetereostructure layers (SCH). FIG. 3C is an example of an optical device having three multiple quantum well (MQW) InGaN/InGaN and/or InGaN/GaN active regions 344 and symmetric separate confinement hetereostructure layers (SCH). Similar to FIG. 3, FIGS. 3A, 3B, and 3C each also shows an n-GAN cladding layer 311, an n-side InGAN SCH 321, p-side InGAN SCH or GaN guide 323, an AlGaN electron block layer 331, and a p-GaN cladding layer 312. Of course, there can be other variations, modification, and alternatives.

In a specific embodiment, the device has a p-type gallium and nitrogen containing cladding material overlying the active region. In a preferred embodiment, the p-type gallium and nitrogen containing cladding material is substantially free from an aluminum species, which leads to imperfections, defects, and other limitations. In one or more preferred embodiment, the cladding material has no aluminum species and is made of a gallium and nitrogen containing material.

In a specific embodiment, the device preferably includes a laser stripe region configured from at least the active region and characterized by a cavity orientation substantially parallel to a projection in a c-direction. Other configurations may also exist depending upon the specific embodiment. The laser strip region has a first end and a second end or other configurations. In a specific embodiment, the device also has a first cleaved facet provided on the first end of the laser stripe region and a second cleaved facet provided on the second end of the laser stripe region.

In yet other embodiments, the present device includes a gallium and nitrogen containing electron blocking region that is substantially free from aluminum species. In yet other embodiments, the device does not include any electron blocking layer or yet in other embodiments, there is no aluminum in the cladding layers and/or electron blocking layer.

In preferred embodiments, the present method and structure is substantially free from InAlGaN or aluminum bearing species in the cladding layers as conventional techniques, such as those in Yoshizumi et al., "Continuous-Wave operation of 520 nm Green InGaN-Based Laser Diodes on Semi-Polar {20-21} GaN Substrates," Applied Physics Express 2

(2009) 092101. That is, the present laser structure and method are substantially free from any aluminum species in the cladding region. Aluminum is generally detrimental. Aluminum often leads to introduction of oxygen in the reactor, which can act as non-radiative recombination centers to reduce the radiative efficiency and introduce other limitations. We also determined that oxygen can compensate p-type dopants in the p-cladding to cause additional resistivity in the optical device. In other aspects, we also determined that aluminum is detrimental to the MOCVD reactor and can react or pre-react with other growth precursors. Use of aluminum cladding layers is also cumbersome and can take additional time to grow. Accordingly, it is believed that the aluminum cladding free laser method and structure are generally more efficient to grow than conventional laser structures.

FIGS. 4 and 5 are photographs of cleaved facets for the device of FIG. 1 according to one or more embodiments of the present invention. These photographs are merely examples, and should not unduly limit the scope of the claims herein. FIG. 4 shows a skipped region for laser facet 410 and a scribed region 420 in the front view of facet on the left. FIG. 4 also shows a vertical facet for laser 430 and an angled facet away from laser 440 in the side view of facet on the right. In FIG. 5, a facet 510 is shown in the plot on the left, with a scribed line 520. FIG. 5 also shows an edge view of cleave 530 in the plot on the right, with an angle 540 of 83.69 degrees. In some embodiments, top side skip-scribe scribing technique is used followed by a break step. In some embodiments, a backside scribe (65 mW) can be used. The top of facet appears relatively smooth and vertical, and the bottom portion has a light curvature.

FIG. 6 is a simplified perspective view of an alternative laser device fabricated on a gallium and nitrogen containing substrate according to an embodiment of the present invention. This diagram is merely an example, which should not unduly limit the scope of the claims herein. One of ordinary skill in the art would recognize other variations, modifications, and alternatives. As shown, the optical device includes a gallium and nitrogen containing substrate member 601 having the off-cut m-plane crystalline surface region according to one or more embodiments. In a specific embodiment, the gallium nitride substrate member is a bulk GaN substrate characterized by having a semipolar or non-polar crystalline surface region, but can be others. In a specific embodiment, the bulk nitride GaN substrate comprises nitrogen and has a surface dislocation density between $10^5$ cm$^{-2}$ and $10^7$ cm$^{-2}$ or below $10^5$ cm$^{-2}$. The nitride crystal or wafer may comprise $Al_xIn_yGa_{1-x-y}N$, where $0 \leq x$, y, $x+y \leq 1$. In one specific embodiment, the nitride crystal comprises GaN. In one or more embodiments, the GaN substrate has threading dislocations, at a concentration between about $10^5$ cm$^{-2}$ and about $10^8$ cm$^{-2}$, in a direction that is substantially orthogonal or oblique with respect to the surface. As a consequence of the orthogonal or oblique orientation of the dislocations, the surface dislocation density is between $10^5$ cm$^{-2}$ and $10^7$ cm$^{-2}$ or below about $10^5$ cm$^{-2}$.

In a specific embodiment on the off-cut GaN, the device has a laser stripe region 603 formed overlying a portion of the off-cut crystalline orientation surface region. In a specific embodiment, the laser stripe region is characterized by a cavity orientation substantially in a projection of a c-direction, which is substantially normal to an a-direction. In a specific embodiment, the laser strip region has a first end 607 and a second end 609. In a preferred embodiment, the device is formed on a projection of a c-direction on a {30-31} gallium and nitrogen containing substrate having a pair of cleaved mirror structures at the first end 607 and the second end 609, which face each other.

In a preferred embodiment, the device has a first cleaved facet provided on the first end of the laser stripe region and a second cleaved facet provided on the second end of the laser stripe region. In one or more embodiments, the first cleaved is substantially parallel with the second cleaved facet. Mirror surfaces are formed on each of the cleaved surfaces. The first cleaved facet comprises a first mirror surface. In a preferred embodiment, the first mirror surface is provided by a scribing and breaking process. The scribing process can use any suitable techniques, such as a diamond scribe or laser scribe or combinations. In a specific embodiment, the first mirror surface comprises a reflective coating. The reflective coating is selected from silicon dioxide, hafnia, and titania, tantalum pentoxide, zirconia, including combinations, and the like. Depending upon the embodiment, the first mirror surface can also comprise an anti-reflective coating.

Also in a preferred embodiment, the second cleaved facet comprises a second mirror surface. The second mirror surface is provided by a scribing and breaking process according to a specific embodiment. Preferably, the scribing is diamond scribed or laser scribed or the like. In a specific embodiment, the second mirror surface comprises a reflective coating, such as silicon dioxide, hafnia, and titania, tantalum pentoxide, zirconia, combinations, and the like. In a specific embodiment, the second mirror surface comprises an anti-reflective coating.

In a specific embodiment, the laser stripe has a length and width. The length ranges from about 50 microns to about 3000 microns. In a preferred embodiment the laser stripe length is about 400 um to about 650 um or about 650 um to about 1200 um. The stripe also has a width ranging from about 0.5 microns to about 1.5 microns, 1.5 microns to about 3 microns, or about 3 microns to about 50 microns but can be other dimensions. In a specific embodiment, the width is substantially constant in dimension, although there may be slight variations. The width and length are often formed using a masking and etching process, which are commonly used in the art. Further details of the present device can be found throughout the present specification and more particularly below.

FIG. 7 is a photograph of cleaved facets for the device of FIG. 5.

A method of processing a laser device according to one or more embodiments may be outline as follows, see also FIG. 8:

1. Start;
2. Provide processed substrate including laser devices with ridges;
3. Thin substrate from backside;
4. Form backside n-contact;
5. Scribe pattern for separation of the laser devices configured in bar structures;
6. Break scribed pattern to form a plurality of bar structures;
7. Stack bar structures;
8. Coat bars structures;
9. Singulate bar structures into individual dies having laser device; and
10. Perform other steps as desired.

The above sequence of steps is used to form individual laser devices on a die from a substrate structure according to one or more embodiments of the present invention. In one or more preferred embodiments, the method includes cleaved facets substantially parallel to each other and facing each other in a ridge laser device configured on a non-polar gallium nitride substrate material. Depending upon the embodiment, one or more of these steps can be combined, or removed, or other steps may be added without departing from the scope of the claims herein.

FIG. 9 is a simplified illustrating of a substrate thinning process according to an embodiment of the present invention. This diagram is merely an illustration and should not unduly limit the scope of the claims herein. One of ordinary skill in the art would recognize other variations, modifications, and alternatives. In a specific embodiment, the method begins with a gallium nitride substrate material including laser devices and preferably ridge laser devices, but can be others. The substrate has been subjected to front side processing according to a specific embodiment. After front side processing has been completed, one or more of the GaN substrates are mounted onto a sapphire carrier wafer or other suitable member. As an example, the method uses Crystalbond 909, which is a conventional mounting thermoplastic. The thermoplastic can be dissolved in acetone or other suitable solvent.

In a specific embodiment, the carrier wafer is mounted to a lapping jig. An example of such lapping jig is made by Logitech Ltd. of the United Kingdom, or other vendor. The lapping jig helps maintain planarity of the substrates during the lapping process according to a specific embodiment. As an example, the starting thickness of the substrates are ~325 um+/−20 um, but can be others. In a specific embodiment, the method laps or thins the substrates down to 60-80 um thickness, but can also be thinner or slightly thicker. In a preferred embodiment, the lapping jig is configured with a lapping plate, which is often made of a suitable material such as cast iron configured with a flatness of less than 5 um, but can be others. Preferably, the method uses a lapping slurry that is 1 part silicon carbide (SiC) and 10 parts water, but can also be other variations. In a specific embodiment, the SiC grit is about 5 um in dimension. In one or more embodiments, the lapping plate speed is suitable at about 10 revolutions per minute. Additionally, the method can adjust the lapping jig's down pressure to achieve a desired lapping rate, such as 2-3 um/min or greater or slightly less according to one or more embodiments.

In a specific embodiment, the present method includes a lapping process that may produce subsurface damage in the GaN material to cause generation of mid level traps or the like. The midlevel traps may lead to contacts having a Schottky characteristic. Accordingly, the present method includes one or more polishing processes such that ~10 um of material having the damage is removed according to a specific embodiment. As an example, the method uses a Politex™ polishing pad of Rohm and Haas, but can be others, that is glued onto a stainless steel plate. A polishing solution is Ultrasol300K manufactured by Eminess Technologies, but can be others. The Ultra-Sol 300K is a high-purity colloidal silica slurry with a specially designed alkaline dispersion. It contains 70 nm colloidal silica and has a pH of 10.6. The solids content is 30% (by weight). In a specific embodiment, the lapping plate speed is 70 rpm and the full weight of the lapping jig is applied. In a preferred embodiment, the method includes a polishing rate of about ~2 um/hour.

In other embodiments, the present invention provides a method for achieving high quality n-type contacts for m-plane GaN substrate material. In a specific embodiment, the method provides contacts that are rough to achieve suitable ohmic contact. In a specific embodiment, the roughness causes exposure of other crystal planes, which lead to good contacts. In a preferred embodiment, the present method includes a lapped surface, which is rough in texture to expose more than one or multiple different crystal planes. In other embodiments, lapping may be followed by etching such as dry etching and/or wet etching. In a specific embodiment, etching removes the subsurface damage, however, it is likely not to planarize the surface like polishing.

FIG. 10 is a simplified diagram illustrating a backside n-contact method according to one or more embodiments. This diagram is merely an illustration and should not unduly limit the scope of the claims herein. One of ordinary skill in the art would recognize other variations, modifications, and alternatives. After the thinning process is complete, the method forms n-contacts on the backside of the substrates according to one or more embodiments. At this point, the thinned substrates are still mounted to and maintained on the sapphire wafer. In a preferred embodiment, the thinned substrates are "batch process" for efficiency and handling. In a specific embodiment, the method using batch processing helps prevent any damage associated with handling very thin (60-80 um) substrates.

As an example, the backside contact includes about 300 Å Al/3000 Å Au or other suitable materials such as Al/Ni/Au. In a specific embodiment, the contact is a stack of metals that are deposited by e-beam evaporation or other suitable techniques. In a preferred embodiment and prior to the metal stack deposition, the method includes use of a wet etch such as an hydrofluoric acid wet etch to remove any oxides on the surface. In a specific embodiment, the metal stack is preferably not annealed or subjected to high temperature processing after its formation. An example of a technique of fabricating a contact region can be found in U.S. Ser. No. 61/257,449 filed Nov. 2, 2009, and entitled "Method of Fabricating Optical Devices Using Laser Treatment," in the names of Nicholas J. Pfister, James W. Raring, and Mathew Schmidt, which is hereby incorporated by reference.

FIG. 11 is a simplified diagram illustrating a scribe and break operation according to one or more embodiments. This diagram is merely an illustration and should not unduly limit the scope of the claims herein. One of ordinary skill in the art would recognize other variations, modifications, and alternatives. After the n-contact is formed, the substrates are demounted from the sapphire carrier wafer and cleaned in acetone and isopropyl alcohol according to a specific embodiment. The substrates are then mounted onto vinyl tape for the scribe and break process depending upon the embodiment. In a preferred embodiment, the tape does not leave any residue on the laser bars, which are substantially free from such residues, which are often polymeric in nature or particulates.

Next, the method includes one or more scribing processes. In a specific embodiment, the method includes subjecting the substrates to a laser for pattern formation. In a preferred embodiment, the pattern is configured for the formation of a pair of facets for one or more ridge lasers. In a preferred embodiment, the pair of facets face each other and are in parallel alignment with each other. In a preferred embodiment, the method uses a UV (355 nm) laser to scribe the laser bars. In a specific embodiment, the laser is configured on a system, which allows for accurate scribe lines configured in one or more different patterns and profiles. In one or more embodiments, the scribing can be performed on the back-side, front-side, or both depending upon the application.

In a specific embodiment, the method uses backside scribing or the like. With backside scribing, the method preferably forms a continuous line scribe that is perpendicular to the laser bars on the backside of the GaN substrate. In a specific embodiment, the scribe is generally 15-20 um deep or other suitable depth. Preferably, backside scribing can be advantageous. That is, the scribe process does not depend on the pitch of the laser bars or other like pattern. Accordingly, backside scribing can lead to a higher density of laser bars on each substrate according to a preferred embodiment. In a specific embodiment, backside scribing, however, may lead to residue from the tape on one or more of the facets. In a specific embodiment, backside scribe often requires that the substrates face down on the tape. With front-side scribing, the backside of the substrate is in contact with the tape.

In a preferred embodiment, the present method uses front-side scribing, which facilitates formation of clean facets. In a specific embodiment, the front-side scribing process is preferably used. In a specific embodiment, the method includes a scribe pattern to produce straight cleaves with minimal facet roughness or other imperfections.

Scribe Pattern: The pitch of the laser mask is about 200 um, but can be others. The method uses a 170 um scribe with a 30 um dash for the 200 um pitch. In a preferred embodiment, the scribe length is maximized or increased while maintaining the heat affected zone of the laser away from the laser ridge, which is sensitive to heat.

Scribe Profile: A saw tooth profile generally produces minimal facet roughness. It is believed that the saw tooth profile shape creates a very high stress concentration in the material, which causes the cleave to propagate much easier and/or more efficiently.

In a specific embodiment, the present method provides for a scribe suitable for fabrication of the present laser devices. As an example, FIG. 9 illustrates cross-sections of substrate materials associated with (1) a backside scribe process; and (2) a front-side scribe process.

Referring now to FIG. 13, the method includes a breaking process to form a plurality of bar structures. This diagram is merely an illustration and should not unduly limit the scope of the claims herein. One of ordinary skill in the art would recognize other variations, modifications, and alternatives. After the GaN substrates are scribed, the method uses a breaker to cleave the substrates into bars. In a specific embodiment, the breaker has a metal support that has a gap spacing of 900 um. The substrate is positioned over the support so that the scribe line is in the centered. A suitably sharp ceramic blade, then applies pressure directly on the scribe line causing the substrate to cleave along the scribe line.

FIG. 14 is a simplified diagram illustrating a stacking and coating process according to one or more embodiments. Again, this diagram is merely an illustration and should not unduly limit the scope of the claims herein. One of ordinary skill in the art would recognize other variations, modifications, and alternatives. After cleaving, the bars are stacked in a fixture that allows for coating the front facet and back facet, which are in parallel alignment with each other and facing each other. The front facet coating films can be selected from any suitable low reflectance design (AR design) or highly reflective coating (HR design). The AR design includes a quarter wave coating of $Al_2O_3$ capped with a thin layer of $HfO_2$ according to a specific embodiment. The $Al_2O_3$ coating is a robust dielectric, and $HfO_2$ is dense, which helps environmentally passivate and tune the reflectance of the front facet. In a specific embodiment, the front facet is coated with a HR design. The HR design includes several quarter wave pairs of $SiO_2/HfO_2$ or $SiO_2/Ta_2O_5$. In a specific embodiment, roughly 3-5 pairs may be used to achieve a reflectance over 80%. In a preferred embodiment, 1-2 pairs is used to achieve a lower reflectivity for higher device output power and efficiency. In another preferred embodiment no facet coating is used on the front mirror. These coating films are preferably deposited by e beam evaporation. In a specific embodiment, the back facet is coated with a high reflectance HR design. The HR design includes several quarter wave pairs of $SiO_2/Ta2O_5$ or $SiO_2/HfO_2$. In a specific embodiment, roughly 6-10 pairs may be used to achieve a reflectance over 99%. In other embodiments, the facet may be exposed gallium and nitrogen containing material that is free from a coating or overlying material for a front facet region.

In a preferred embodiment, the method uses a suitable deposition system configured for deposition of each of the facets without breaking vacuum. The deposition system includes a dome structure with sufficient height and spatial volume. The system allows for the plurality of bars configured in a fixture to be flipped from one side to another side and to expose the back facet and the front facet according to a specific embodiment. In a preferred embodiment, the method allows for first deposition of the back facet, reconfiguring the bar fixture to expose the front facet, and second deposition of the front facet without breaking vacuum. In a preferred embodiment, the method allows for deposition of one or more films on front and back without breaking vacuum to save time and improve efficiency. Other embodiments can break vacuum.

FIG. 15 illustrates a method directed to singulate bars into a plurality of die according to a specific embodiment. This diagram is merely an illustration and should not unduly limit the scope of the claims herein. One of ordinary skill in the art would recognize other variations, modifications, and alternatives. After the facets of the bars have been coated, the method includes testing the laser devices in bar form prior to die singulation. In a specific embodiment, the method singulates the bars by performing a scribe and break process (similar to the facet cleave). Preferably, the method forms a shallow continuous line scribe on the top side of the laser bar according to a specific embodiment. The width of each die is about 200 um, which may reduce the support gap to 300 um or so. After the bars have been cleaved into individual die, the tape is expanded and each of the die is picked off of the tape. Next, the method performs a packing operation for each of the die according to one or more embodiments.

FIG. 16 is a simplified plot illustrating light output voltage characteristics of laser stripes according to an embodiment of the present invention. Shown are the voltage and light output of 1200 μm long by 1.4 to 2.0 μm wide uncoated lasers fabricated on {20-21} with an epitaxial structure oriented in the projection of the c-direction 1610 and the a-direction 1620. The higher optical output power and the demonstration of a laser device of the projection of the c-direction lasers is an indication that the gain is higher for projection of c-direction oriented lasers. In this example, the device included gallium and nitrogen containing cladding layers that were substantially free from aluminum species. FIG. 16 also shows laser demonstration on {20-21} 1630.

FIG. 17 is a simplified plot illustrating light output voltage characteristics of laser stripes according to a preferred embodiment of the present invention. Shown are voltage and light output of HR coated 1200 μm long by 1.4 to 2.0 μm wide lasers fabricated on {20-21} with an epitaxial structure oriented in the projection of the c-direction and the a-direction according to preferred embodiments of the present invention. The lower threshold currents and higher slope efficiency of the projection of the c-direction lasers is an indication that the gain characteristic is favorable for projection of c-direction oriented lasers. In this example, the device included gallium and nitrogen containing cladding layers that were substantially free from aluminum species.

FIG. 18 is a simplified plot of voltage and light characteristics of a 522 nm laser device according to an embodiment of the present invention. Shown are voltage and light output of HR coated 1200 µm long by 1.6 µm wide lasers fabricated on {20-21} with the present epitaxial structure oriented in the projection of the c-direction. Also shown is the lasing spectra of the laser device operating with a peak wavelength of 515 nm, which is clearly in the green regime. In this example, the device included gallium and nitrogen containing cladding layers that were substantially free from aluminum species and thin barrier region.

FIG. 19 is a simplified plot of voltage and light characteristics of a continuous wave 525 nm laser device according to an embodiment of the present invention. This diagram is merely an illustration and should not unduly limit the scope of the claims herein. One of ordinary skill in the art would recognize other variations, modifications, and alternatives. As shown is a simplified plot of continuous wave (CW) voltage and current versus light characteristics of a laser device fabricated on {20-21} operating at a peak wavelength of 525 nm and maximum output power of over 6.5 mW according to an embodiment of the present invention. Shown are voltage and light output of HR coated laser device with a cavity that is approximately 600 µm long by approximately 1.6 µm oriented in the projection of the c-direction according to one or more embodiments. In this example, the device included gallium and nitrogen containing cladding layers that were substantially free from aluminum species.

FIG. 20 is a simplified plot of voltage and light characteristics of a continuous wave 520 nm laser device operable at 45 mWatts according to an embodiment of the present invention. This diagram is merely an illustration and should not unduly limit the scope of the claims herein. One of ordinary skill in the art would recognize other variations, modifications, and alternatives. As shown is a simplified plot of continuous wave (CW) voltage and current versus light characteristics of a laser device fabricated on {20-21} operating at a peak wavelength of 520 nm and maximum output power of 60 mW and wall-plug efficiency of 1.7% according to an embodiment of the present invention. Shown are voltage and light output of HR coated laser device with a cavity that is approximately 600 µm long by approximately 1.6 µm oriented in the projection of the c-direction according to one or more embodiments. In this example, the device included gallium and nitrogen containing cladding layers that were substantially free from aluminum species.

FIG. 21 is a simplified diagram of forward voltage at three difference current densities for micro-LED devices fabricated from 5 quantum well laser diode epitaxial structures with various barrier thicknesses. As used herein, the micro-LED devices have been used for experimental and demonstration purposes only. As shown, a clear dependence of forward voltage for the different barrier thicknesses can be observed where barriers in the 2 nm to 3 nm range provide significantly lower voltage than thicker barriers. Accordingly, demonstration of a forward voltage for barrier thicknesses has been achieved.

FIG. 22 is a simplified diagram of voltage versus current characteristic from single lateral mode green laser diode with ~600 micron cavity length according to a specific embodiment. As shown, the epitaxial structure is comprised of a multi-quantum well active region with greater than 4 quantum wells and utilizes thin barriers in the 3 nm range. As shown, the forward voltage remains less than 7V in the expected operating current range for an output power of 60 mW or greater. Accordingly, demonstration of a forward voltage of 7V in the current range has been achieved.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero).

As shown, the present device can be enclosed in a suitable package. Such package can include those such as in TO-38 and TO-56 headers. Other suitable package designs and methods can also exist, such as TO-9 and even non-standard packaging. In a specific embodiment, the present device can be implemented in a co-packaging configuration such as those described in U.S. Provisional Application No. 61/347,800, commonly assigned, and hereby incorporated by reference for all purposes.

In other embodiments, the present laser device can be configured in a variety of applications. Such applications include laser displays, metrology, communications, health care and surgery, information technology, and others. As an example, the present laser device can be provided in a laser display such as those described in U.S. application Ser. No. 12/789,303 filed May 27, 2010, which claims priority to U.S. Provisional Nos. 61/182,105 filed May 29, 2009 and 61/182,106 filed May 29, 2009, each of which is incorporated by reference herein. An alternative approach is described in U.S. application Ser. No. 12/759,273, entitled "Optical Device Structure Using GAN Substrates For Laser Applications," filed Apr. 13, 2010, which is also hereby incorporated by reference.

While the above is a full description of the specific embodiments, various modifications, alternative constructions and equivalents may be used. In a specific embodiment, the present device and method includes a cladding layer free from AlGaN cladding or other cladding layers substantially free from an aluminum bearing species, which may be about 2% aluminum or less or no aluminum in some embodiments. In other embodiments, the present method and device can include barrier thickness ranges from 3 nm to 6.5 nm and 8 nm, although thinner barrier materials are preferred. In a preferred embodiment, the barrier material has a thickness of 1.5 nm to 5 or 6 nm range, but most preferably between 1.5 nm and 3.5 nm or 4 nm. In more preferable embodiments, the barrier material thicknesses are less than about 5 nm, less than about 4 nm, less than about 3 nm, or less than about 2 nm. In a specific embodiment, the device and method also includes quantum well thickness ranges of about 2.5 nm to 3.5 nm, 3.5 nm to 4.5 nm, or others. In a specific embodiment, the quantum well thickness can also include a range of 3 to 4 nm or 4 to 6 nm. In a preferred embodiment, the device has an operating voltage at 60 mW or greater and is characterized by a voltage drop of less than about 7V, less than about 6.5V, or less than about 6V. Therefore, the above description and illustrations should not be taken as limiting the scope of the present invention, which is defined by the appended claims.

What is claimed is:

1. A method of manufacturing a laser diode device, the method comprising:
   providing a gallium and nitrogen containing material including a {20-21} crystalline surface region orientation;
   forming an n-type cladding material overlying the gallium and nitrogen containing material, the n-type cladding material being substantially free from an aluminum bearing material;
   forming an active region comprising at least three quantum wells and a plurality of barrier layers, each of the quantum wells having a thickness of 1 nm and greater, and each of the plurality of barrier layers having a thickness ranging from 1 nm to less than 3 nm, each adjacent pair of the quantum wells separated by one of the plurality of barrier layers;
   forming a p-type cladding material overlying the active region, the p-type cladding material being free from AlGaN;
   forming a p-type material overlying the p-type cladding material;
   forming a laser stripe region overlying the crystalline surface region, the laser stripe region being aligned substantially in a projection of the c-direction, the laser stripe region comprising a first end and a second end;
   forming a first facet on the first end; and
   forming a second facet on the second end.

2. The method of claim 1, wherein the active region comprises at least six quantum well regions.

3. The method of claim 1, wherein the active region is configured operably for a forward voltage of less than 7 v for an output power of 60 mW and greater.

4. The method of claim 1, wherein the plurality of barrier layers is at least about 2.5 nm in thickness.

5. The method of claim 1, wherein each of the plurality of barrier layers is at least about 1.5 nm to about 2.5 nm in thickness.

6. The method of claim 1, wherein the {20-21} crystalline surface region is off-cut less than less than +/−10 deg towards a c-plane and/or an a-plane.

7. The method of claim 1, wherein one or more of the plurality of barrier layers is made of a material selected from GaN, InGaN, AlGaN, or InAlGaN.

8. The method of claim 1, wherein each of the quantum wells comprises at least InGaN.

9. The method of claim 1, wherein each of the plurality of barrier layers is substantially free from a dopant species.

10. A method of manufacturing a laser diode device, the method comprising:
    providing a gallium and nitrogen containing material including a {20-21} crystalline surface region orientation;
    forming an n-type cladding material overlying the gallium and nitrogen containing material, the n-type cladding material being substantially free from an aluminum bearing material;
    forming an active region comprising at least three quantum wells and a plurality of barrier layers, each of the quantum wells having a thickness of 1nm and greater, and each of the plurality of barrier layers having a p-type characteristic and a thickness ranging from 1nm to less than 3 nm, each adjacent pair of the quantum wells separated by one of the plurality of barrier layers;
    forming a p-type cladding material overlying the active region, the p-type cladding material being substantially free from AlGaN;
    forming a p-type material overlying the p-type cladding material;
    forming a laser stripe region overlying the crystalline surface region, the laser stripe region being aligned substantially in a projection of the c-direction, the laser stripe region comprising a first end and a second end such that a first facet is formed on the first end, and a second facet is formed on the second end.

11. The method of claim 10, wherein the active region is configured operably for a forward voltage of less than 7 v for an output power of 60 mW and greater.

12. The method of claim 10, wherein each of the plurality of barrier layers is at least about 2.5 nm in thickness.

13. The method of claim 10, wherein each of the plurality of barrier layers is at least about 1.5 nm to about 2.5 nm in thickness.

14. The method of claim 10, wherein the {20-21} crystalline surface region is off-cut less than less than +/−8 deg towards a c-plane and/or an a-plane.

15. The method of claim 10, wherein the active region comprises at least six quantum well regions.

* * * * *